(12) United States Patent
Suk et al.

(10) Patent No.: US 9,923,058 B2
(45) Date of Patent: *Mar. 20, 2018

(54) SEMICONDUCTOR DEVICE HAVING A FIN

(71) Applicant: SAMSUNG ELECTRONICS CO., LTD., Suwon-si, Gyeonggi-Do (KR)

(72) Inventors: Sung-Dae Suk, Seoul (KR); Kang-Ill Seo, Chungcheongbuk-Do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/196,209

(22) Filed: Jun. 29, 2016

(65) Prior Publication Data
US 2017/0018610 A1 Jan. 19, 2017

Related U.S. Application Data

(62) Division of application No. 14/802,898, filed on Jul. 17, 2015, now Pat. No. 9,425,259.

(51) Int. Cl.
*H01L 29/78* (2006.01)
*H01L 29/10* (2006.01)
*H01L 29/165* (2006.01)
*H01L 29/775* (2006.01)
*H01L 29/06* (2006.01)
*H01L 29/423* (2006.01)
(Continued)

(52) U.S. Cl.
CPC ...... *H01L 29/1054* (2013.01); *H01L 29/0653* (2013.01); *H01L 29/0673* (2013.01); *H01L 29/0847* (2013.01); *H01L 29/165* (2013.01); *H01L 29/42392* (2013.01); *H01L 29/66545* (2013.01); *H01L 29/66795* (2013.01); *H01L 29/775* (2013.01); *H01L 29/785* (2013.01); *H01L 29/7848* (2013.01); *H01L 29/7851* (2013.01); *H01L 29/78696* (2013.01)

(58) Field of Classification Search
None
See application file for complete search history.

(56) References Cited

U.S. PATENT DOCUMENTS 7,045,401 B2 5/2006 Lee et al.
7,821,061 B2 10/2010 Jin et al.
(Continued)

OTHER PUBLICATIONS

Parent U.S. Appl. No. 14/802,898, filed Jul. 17, 2015 (not published yet).

*Primary Examiner* — Daniel Whalen
(74) *Attorney, Agent, or Firm* — F. Chau & Associates, LLC

(57) ABSTRACT

Provided is a semiconductor device. The semiconductor device includes a fin disposed on a substrate along a first direction. A sacrificial layer is disposed on the fin. An active layer is disposed on the sacrificial layer. A gate insulating layer and a gate electrode are disposed along a second direction intersecting the first direction. The gate insulating layer covers substantially entire top, side and bottom surfaces of the active layer. A source or drain region is disposed on at least one side of the gate electrode on the substrate. A first concentration of germanium in a first region and a second region of the active layer is higher than a second concentration of germanium in a third region disposed between the first region and the second region.

11 Claims, 39 Drawing Sheets

(51) Int. Cl.
*H01L 29/66* (2006.01)
*H01L 29/786* (2006.01)
*H01L 29/08* (2006.01)

(56) References Cited

U.S. PATENT DOCUMENTS

| | | |
|---|---|---|
| 8,071,983 B2 | 12/2011 | Brask et al. |
| 8,211,772 B2 | 7/2012 | Kavalieros et al. |
| 8,395,195 B2 | 3/2013 | Chang et al. |
| 8,552,477 B2 | 10/2013 | Zhu |
| 8,703,565 B2 | 4/2014 | Chang et al. |
| 9,425,259 B1 * | 8/2016 | Suk .................... H01L 29/1054 |
| 2006/0216897 A1 | 9/2006 | Lee et al. |
| 2008/0079041 A1 | 4/2008 | Suk et al. |
| 2012/0025312 A1 | 2/2012 | Scheiper et al. |
| 2012/0138886 A1 | 6/2012 | Kuhn et al. |
| 2013/0248948 A1 | 9/2013 | Ma et al. |
| 2013/0313619 A1 | 11/2013 | Fumitake |
| 2016/0013186 A1 | 1/2016 | Bae et al. |
| 2016/0013309 A1 * | 1/2016 | Bae ...................... H01L 29/785 257/351 |

* cited by examiner

1200

1300

1400

SEMICONDUCTOR DEVICE HAVING A FIN

CROSS-REFERENCE TO RELATED APPLICATION

This U.S. Non-Provisional Patent Application is a Divisional of U.S. patent application Ser. No. 14/802,898, filed on Jul. 17, 2015, the disclosure of which is incorporated by reference herein in its entirety.

TECHNICAL FIELD

Exemplary embodiments of the present inventive concept relate to a semiconductor device, and more particularly to a semiconductor device having a fin.

DISCUSSION OF RELATED ART

Semiconductor devices may operate at high speeds and low voltages. A process of fabricating a semiconductor device may increase device integration density.

Increased integration density can cause a short channel effect in a field effect transistor. A fin field effect transistor (FinFET), which may include a channel having a three-dimensional spatial structure, may reduce the occurrence of the short channel effect.

SUMMARY

According to an exemplary embodiment of the present inventive concept, a semiconductor device includes a fin disposed on a substrate along a first direction. A sacrificial layer is disposed on the fin. An active layer is disposed on the sacrificial layer. A gate insulating layer and a gate electrode are disposed along a second direction intersecting the first direction. The gate insulating layer covers substantially entire top, side and bottom surfaces of the active layer. A source or drain region is disposed on at least one side of the gate electrode on the substrate. A first concentration of germanium in a first region and a second region of the active layer is higher than a second concentration of germanium in a third region disposed between the first region and the second region.

According to an exemplary embodiment of the present inventive concept, a semiconductor device includes a fin disposed on a substrate along a first direction. A sacrificial layer is disposed on the fin. An active layer is disposed on the sacrificial layer. A gate insulating layer and a gate electrode are disposed along a second direction intersecting the first direction. The gate insulating layer covers substantially entire top, side and bottom surfaces of the active layer. A source or drain region is disposed on at least one side of the gate electrode on the substrate. A width of each of a first region and a second region of the active layer measured in the second direction is greater than a width of a third region of the active layer measured in the second direction. The third region is disposed between the first region and the second region.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
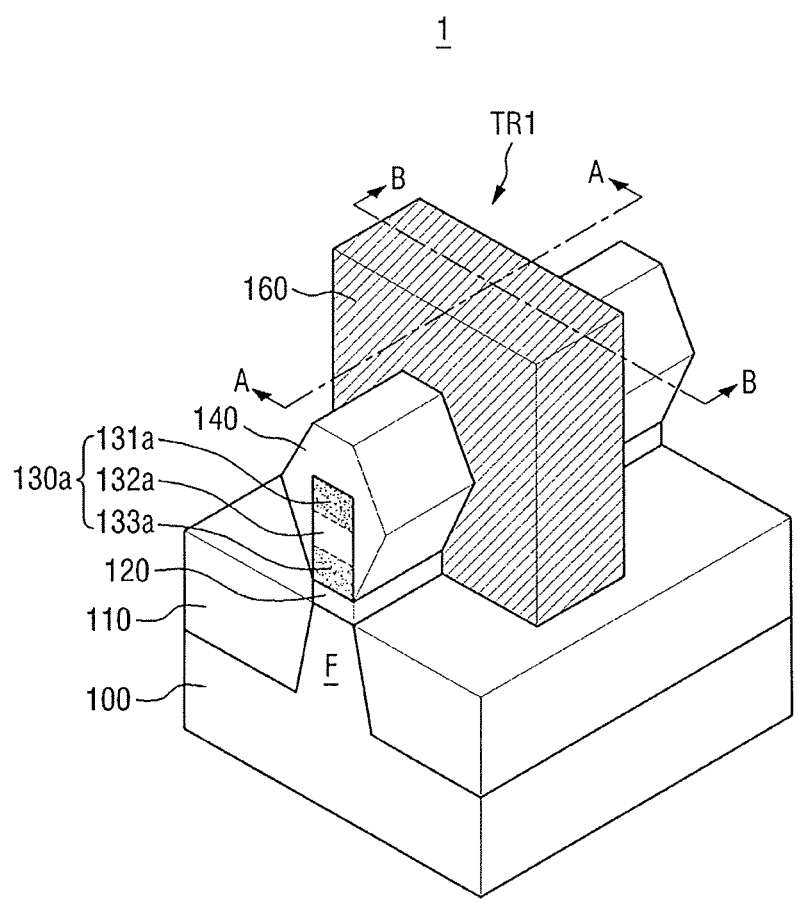
FIG. 1 is a perspective view of a semiconductor device according to an exemplary embodiment of the present inventive concept.

Aspects and features of the present inventive concept and methods of accomplishing the same may be understood more readily by reference to the following detailed description of exemplary embodiments of the present inventive concept and the accompanying drawings. Exemplary embodiments of the present inventive concept may, however, be embodied in many different forms and should not be construed as being limited to the exemplary embodiments set forth herein. Like reference numerals may refer to like elements throughout the specification and drawings.

The terminology used herein is for the purpose of describing particular exemplary embodiments only and is not intended to be limiting of the inventive concept.

It will be understood that when an element or layer is referred to as being "on", "connected to" or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms.

Spatially relative terms, such as "beneath", "below", "lower", "above", "upper", and the like, may be used herein to describe one element or feature's relationship to another element(s) or feature(s) as illustrated in the figures. It will be understood that the spatially relative terms are intended to encompass different orientations of the device in use or operation in addition to the orientation depicted in the figures.

Exemplary embodiments may be described herein with reference to cross-sectional illustrations that may be schematic illustrations of idealized exemplary embodiments (and/or intermediate structures). As such, variations from the shapes of the illustrations as a result, for example, of manufacturing techniques and/or tolerances, may occur. Thus, exemplary embodiments of the present inventive concept should not be construed as limited to the particular shapes of regions illustrated herein but are to include deviations in shapes that result, for example, from manufacturing.

Hereinafter, semiconductor devices according to exemplary embodiments of the present inventive concept will be described in more detail with reference to FIGS. 1 through 39.

Figure 2:
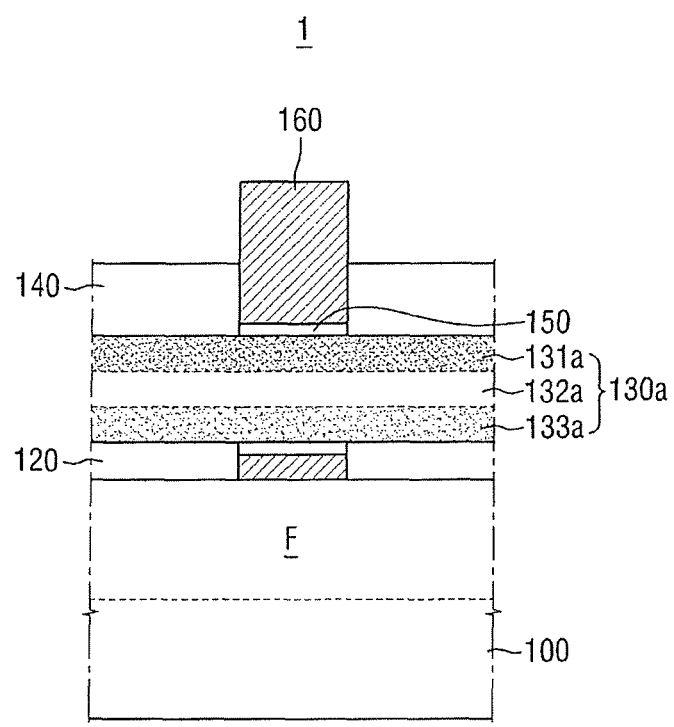
FIG. 2 is a cross-sectional view taken along line A-A of FIG. 1.
Figure 3:
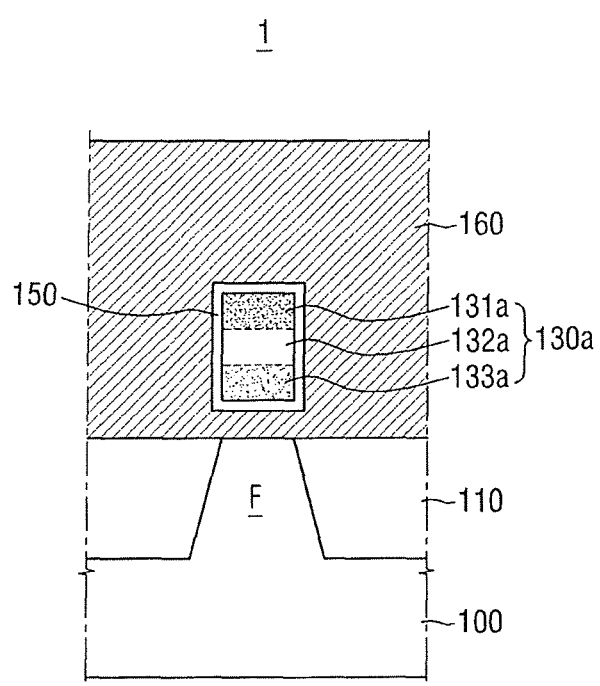
FIG. 3 is a cross-sectional view taken along line B-B of FIG. 1.

FIG. 1 is a perspective view of a semiconductor device according to an exemplary embodiment of the present inventive concept. FIG. 2 is a cross-sectional view taken along line A-A of FIG. 1. FIG. 3 is a cross-sectional view taken along line B-B of FIG. 1.

Referring to FIGS. 1 through 3, a semiconductor device 1 may include a substrate 100, a fin F, a device isolation layer 110, a sacrificial layer 120, an active layer 130a, source or drain regions 140, a gate insulating layer 150, and a gate electrode 160.

The semiconductor device 1 according to an exemplary embodiment of the present inventive concept will hereinafter be described using a fin type transistor (TR1) as an example. However, the present inventive concept is not limited to this example.

Referring to FIGS. 1 through 3, the substrate 100 may be, for example, a bulk silicon substrate. The substrate 100 may be a silicon substrate or may be a substrate including a material such as silicon germanium, indium antimonide, lead telluride, indium arsenide, indium phosphide, gallium arsenide, or gallium antimonide.

The substrate 100 may include a base substrate and an epitaxial layer disposed on the base substrate. If an active fin includes the epitaxial layer disposed on the base substrate, the epitaxial layer may include an element semiconductor material such as silicon or germanium. The epitaxial layer may include a compound semiconductor such as a group IV-INT compound semiconductor or a group III-V compound semiconductor. The group IV-IV compound semiconductor included in the epitaxial layer may be a binary or ternary compound including two or more of carbon (C), silicon (Si), germanium (Ge) and tin (Sn) or a compound obtained by doping the binary or ternary compound with a group IV element. The group III-V compound semiconductor included in the epitaxial layer may be a binary, ternary, or quaternary compound composed of at least one of aluminum (Al), gallium (Ga) and indium (In) (e.g., group III elements) bonded with one of phosphorus (P), arsenic (As) and antimony (Sb) (e.g., group V elements).

In some exemplary embodiments of the present inventive concept, the substrate 100 may be an insulating substrate. For example, a silicon-on-insulator (SOI) substrate may be used. The SOI substrate may reduce a delay time in the operation process of the semiconductor device 1.

The fin F may be disposed on the substrate 100. In some exemplary embodiments of the present inventive concept, the fin F may include a same material as the substrate 100. For example, if the substrate 10 includes silicon, the fin F may also include silicon. However, the present inventive concept is not limited thereto, and modifications can be made as desired. For example, in some exemplary embodiments of the present inventive concept, the substrate 100 and the fin F may include different materials.

The fin F may extend along a first direction and may protrude from the substrate 100. In some exemplary embodiments of the present inventive concept, the fin F may be formed by partially etching the substrate 100, but the present inventive concept is not limited thereto.

In the drawings, the fin F may have a tapered cross-sectional shape. In other words, the fin F may become wider from the top toward the bottom. However, the cross-sectional shape of the fin F is not limited to the tapered shape. In some exemplary embodiments of the present inventive concept, the cross-sectional shape of the fin F may be a quadrilateral shape. In some exemplary embodiments of the present inventive concept, the cross-sectional shape of the fin F may be a chamfered shape. For example, corners of the fin F may be rounded.

The device isolation layer 110 may cover side surfaces of the fin F. In some exemplary embodiments of the present inventive concept, the device isolation layer 110 may be, for example, an insulating layer. The device isolation layer 110 may include, but is not limited to, a silicon oxide ($SiO_2$) layer, a silicon nitride (SiN) layer or a silicon oxynitride (SiON) layer.

In some exemplary embodiments of the present inventive concept, the device isolation layer 110 may be a shallow trench isolation (STI) layer, but the present inventive concept is not limited thereto. In some exemplary embodiments of the present inventive concept, the device isolation layer 110 may be a deep trench isolation (DTI) layer. However, the device isolation layer 110 according to exemplary embodiments of the present inventive concept is not limited to the device isolation layers illustrated in the drawings.

The sacrificial layer 120 may be disposed on the fin F. In an exemplary embodiment of the present inventive concept, the sacrificial layer 120 may include, for example, a semiconductor material. The sacrificial layer 120 may include, for example, silicon (Si) or silicon germanium (SiGe). If the sacrificial layer 120 includes silicon germanium, the proportion of germanium (Ge) in the sacrificial layer 120 may be higher or lower than that of silicon (Si) included in the sacrificial layer 120. The proportion of germanium in the sacrificial layer 120 may be higher than that of silicon (Si) in the sacrificial layer 120, which may increase the etch selectivity of the sacrificial layer 120 in a subsequent fabrication process. The sacrificial layer 120 according to the current exemplary embodiment of the present inventive concept is not limited to the above example, and the composition of the sacrificial layer 120 can be changed as desired.

As illustrated in the drawings, the sacrificial layer 120 may be disposed under portions of the active layer 130a on which the source or drain regions 140 are disposed and need not be disposed under a portion of the active layer 130a on which the gate electrode 160 may be disposed. The gate electrode 160 may penetrate the sacrificial layer 120 and may completely surround the active layer 130a. The gate electrode 160 may completely cover top, side and bottom surfaces of the active layer 130a.

The active layer 130a may be disposed on the sacrificial layer 120. The active layer 130a may be used as a channel of a first transistor TR1. In some exemplary embodiments of the present inventive concept, the sacrificial layer 120 may include silicon (Si) or an insulating material. The active layer 130a may include a semiconductor material including silicon germanium.

The active layer 130a may include an upper region 131a, a middle region 132a, and a lower region 133a. The upper region 131a, the middle region 132a and the lower region 133a of the active layer 130a may be stacked sequentially. The upper region 131 a may be further from the substrate 100 than the middle region 132a.

Three different surfaces of each of the upper region 131a and the lower region 133a of the active layer 130a may face the gate electrode 160. Side surfaces of the middle region 132a of the active layer 130a may face the gate electrode 160. Accordingly, the middle region 132a may have relatively lower gate controllability than the upper region 131a and a short channel effect may be relatively more likely to occur in the middle region 132a than in the upper region 131a or the lower region 133a. The lower region 133a may have a tri-gate structure.

Therefore, the concentration of germanium in the upper region 131a or the lower region 133a of the active layer 130a may be relatively higher than that of the germanium concentration in the middle region 132a disposed between the upper region 131 and the lower region 133a of the active layer 130a. For example, the concentration of germanium in the upper region 131a or the lower region 133a may be relatively higher than that of germanium in the middle region 132a by 25% or more, but the present inventive concept is not limited thereto. The middle region 132a may serve as a strain relief buffer (SRB) and may increase an operating current capability of the first transistor TR1.

Referring to FIG. 3, widths of the upper region 131a and the lower region 133a of the active layer 130a measured in a second direction intersecting the first direction may be equal to a width of the middle region 132a measured in the second direction. The active layer 130a may have a quad-rilateral cross-sectional shape. The active layer 130a may be separated from the fin F. The gate electrode 160 and the gate insulating layer 150 may be disposed between the active layer 130a and the fin F.

The gate insulating layer 150 may completely cover a part of the active layer 130a. The gate insulating layer 150 may be conformally disposed along the active layer 130a. In some exemplary embodiments of the present inventive concept, the gate insulating layer 150 may be a high-k layer. In this case, the gate insulating layer 150 may include a high-k material. In some exemplary embodiments of the present inventive concept, the high-k material may be, but is not limited to, $HfO_2$, $Al_2O_3$, $ZrO_3$, or $TaO_2$.

Although not specifically illustrated in the drawings, an interface layer may be disposed between the gate insulating layer 150 and the active layer 130a. The interface layer may reduce or prevent the occurrence of a poor interface between the substrate 100 and the gate insulating layer 150. The interface layer may include a low-k material layer having a dielectric constant (k) of 9 or less such as a silicon oxide layer (e.g., having a dielectric constant k of approximately 4) or a silicon oxynitride layer (e.g., having a dielectric constant k of approximately 4 to 8 according to contents of oxygen atoms and nitrogen atoms). The interface layer may include a silicate or any combination of the above exemplary layers.

The gate electrode 160 may be disposed on the gate insulating layer 150. The gate electrode 160 may completely surround the active layer 130a. The first transistor TR1 according to an exemplary embodiment of the present inventive concept may have a gate all around (GAA) structure.

In some exemplary embodiments of the present inventive concept, the gate electrode 160 may include a metal gate electrode. The gate electrode 160 may include a metal. The metal included in the gate electrode 160 may have relatively high conductivity. For example, the metal may include, but is not limited to, aluminum (Al) and/or tungsten (W).

Although not specifically illustrated in the drawings, the gate electrode 160 may include a work function layer, which may control a work function of the first transistor TRI. For example, if the first transistor TR1 is a p-channel metal oxide semiconductor (PMOS) transistor, the work function layer may include a P-type work function layer. The P-type work function layer may include at least one of TiN and TaN. The P-type work function layer may be, but is not limited to, a single layer including, for example, TiN or a double layer including a Tin lower layer and a TaN upper layer.

The source or drain regions 140 may be disposed on both sides of the gate electrode 160. In an exemplary embodiment of the present inventive concept, the source or drain regions 140 may be formed by, e.g., an epitaxial growth process. The source or drain regions 140 may be disposed higher than the sacrificial layer 120. The source or drain regions 140 may cover the active layer 130a. However, the shape of the source or drain regions 140 according to exemplary embodiments of the present inventive concept is not limited to this example, and the shape of the source or drain regions 140 may be changed as desired. For example, in some exemplary embodiments of the present inventive concept, the source or drain regions 140 may be formed by performing an ion implant (IIP) process on the active layer 130a.

When the semiconductor device 1 according to the current exemplary embodiment is a PMOS transistor, the source or drain regions 140 may include a compressive stress material. For example, the compressive stress material may be a material (e.g., SiGe) having a greater lattice constant than silicon (Si). The compressive stress material may increase the mobility of carriers in a channel region by applying compressive stress to the fin F. The sacrificial layer 120 disposed under the source or drain regions 140 may improve operating characteristics of the first transistor TR1 by applying compressive stress to the active layer 130a. The amount of compressive stress applied to the active layer 130a may be adjusted by controlling the amount of germanium (Ge) included in the sacrificial layer 120.

If the semiconductor device 1 is an n-channel metal oxide semiconductor (NMOS) transistor, the source or drain regions 140 may include a same material as the substrate 100. For example, the source or drain regions 140 may include a tensile stress material. For example, if the substrate 100 includes silicon (Si), the source or drain regions 140 may include silicon (Si) or a material (e.g., SiC) having a smaller lattice constant than silicon (Si).

Although not specifically illustrated in the drawings, an interlayer insulating film may be disposed on the device isolation layer 110. The interlayer insulating film may cover the sacrificial layer 120, the source or drain regions 140, and the gate electrode 160.

In the semiconductor device 1 according an exemplary embodiment of the present inventive concept, the gate electrode 160 may be disposed under the active layer 130a, which may be used as a channel. Accordingly, the operating current of the first transistor TR1 may be increased, and a leakage current may be reduced compared with when a fin type transistor is disposed directly on bulk silicon.

The concentration of germanium in the upper region 131a and the lower region 133a of the active layer 130a may be higher than that of the germanium concentration in the middle region 132a. This may improve the operating characteristics of the middle region 132a, and reduce or eliminate the occurrence of a short channel effect. The short channel effect may be relatively more likely to occur in the middle region 132a than in the upper region 131 a or the lower region 133a.

Figure 4:
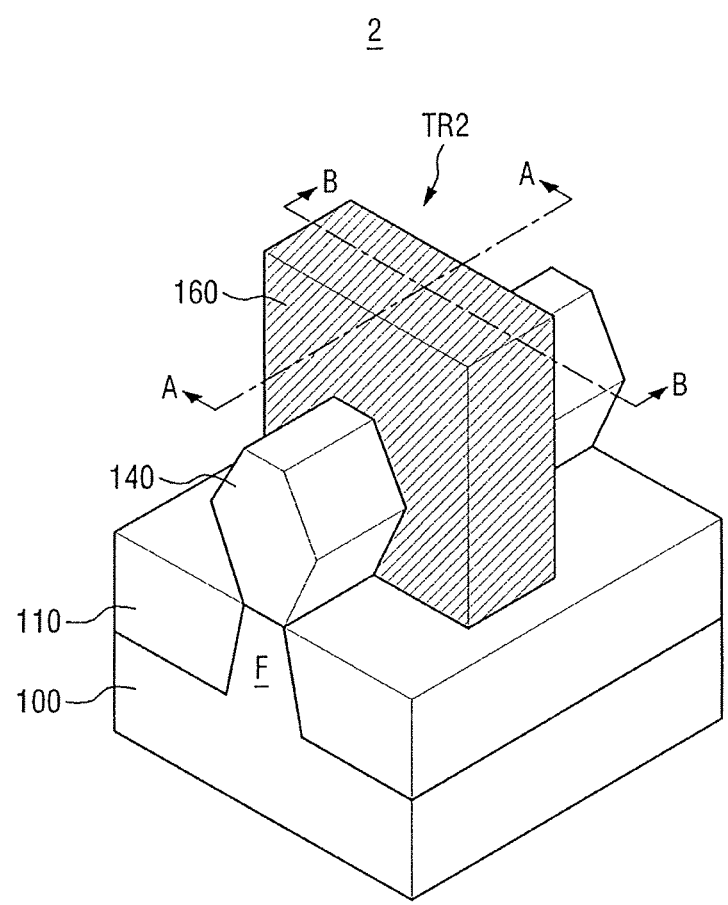
FIG. 4 is a perspective view of a semiconductor device according to an exemplary embodiment of the present inventive concept.
Figure 5:
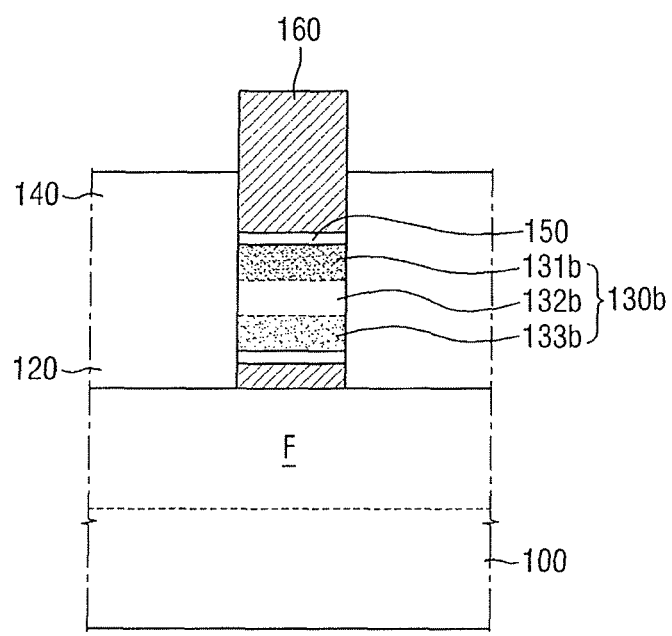
FIG. 5 is a cross-sectional view taken along line A-A of FIG. 4.
Figure 6:
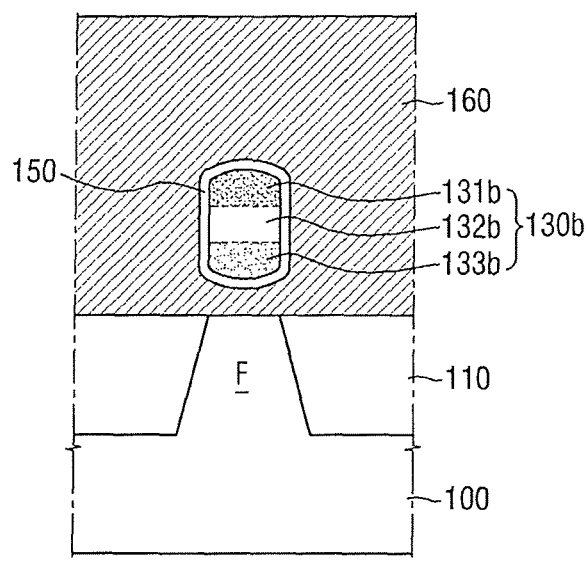
FIG. 6 is a cross-sectional view taken along line B-B of FIG. 4.

FIG. 4 is a perspective view of a semiconductor device 2 according to an exemplary embodiment of the present inventive concept. FIG. 5 is a cross-sectional view taken along line A-A of FIG. 4. FIG. 6 is a cross-sectional view taken along line B-B of FIG. 4. Descriptions of elements substantially identical to those of the previous exemplary embodiments may be omitted. The current exemplary embodiment of the present inventive concept may be described hereinafter focusing on differences from the previous exemplary embodiments of the present inventive concept.

Referring to FIGS. 4 through 6 the semiconductor device 2 according to an exemplary embodiment of the present inventive concept might not include a sacrificial layer 120. The semiconductor device 2 according to an exemplary embodiment of the present inventive concept might not include a portion of an active layer 130b which does not overlap a gate electrode 160 or a gate insulating layer 150.

When a region of the active layer 130b which overlaps the gate electrode 160 or the gate insulating layer 150 is a first region and the other region of the active layer 130b is a second region, the second region of the active layer 130b might not exist. Therefore, the active layer 130b might not exist under the source or drain regions 140. Bottom surfaces of the source or drain regions 140 may contact the top surface of the fin F, and side surfaces of the source or drain regions 140 may contact the active layer 130b and the gate insulating layer 150. However, the present inventive concept is not limited thereto. Spacers (not illustrated) may be disposed between the source or drain regions 140 and the gate insulating layer 150.

In an exemplary embodiment of the present inventive concept, the source or drain regions 140 may be formed by, e.g., an epitaxial growth process. Although not specifically illustrated in the drawings, a seed layer for epitaxial growth may be formed under the source or drain regions 140 in the epitaxial process. Impurities may be in-situ-doped in the epitaxial process if desired.

In the drawings, the source or drain regions 140 are hexagonal. However, the shape of the source or drain regions 140 is not limited to the hexagonal shape. The source or drain regions 140 may have various shapes including, for example, a diamond shape, a rectangular shape and a pentagonal shape by controlling conditions of the epitaxial process for forming the source or drain regions 140.

The active layer 130b may connect the source or drain regions 140 and may be used as a channel of a second transistor TR2. The active layer 130b may function as a nanowire.

A cross-section of the active layer 130b may have an elliptical shape. An outer surface of each of an upper region 131b and a lower region 133b of the active layer 130b may be curved. Side surfaces of the middle region 132b of the active layer 130b may face the gate electrode 160. Accordingly, the middle region 132b may have relatively lower gate controllability than the upper region 13 1b and the lower region 133b, which may have curved outer surface. The short channel effect may be relatively more likely to occur in the middle region 132b than in the upper region 131b or the lower region 133b.

Therefore, the concentration of germanium in the upper region 131b or the lower region 133b of the active layer 130b according an exemplary embodiment of the present inventive concept may be higher than that of the germanium concentration in the middle region 132b disposed between the upper region 131b and the lower region 133b. For example, the concentration of germanium in the upper region 13 1b or the lower region 133b may be higher than that of the germanium concentration in the middle region 132b by 25% or more, but the present inventive concept is not limited thereto. The middle region 132b of the semiconductor device 2 according to an exemplary embodiment of the present inventive concept may serve as an SRB and may increase the operating current capability of the second transistor TR2.

Figure 7:
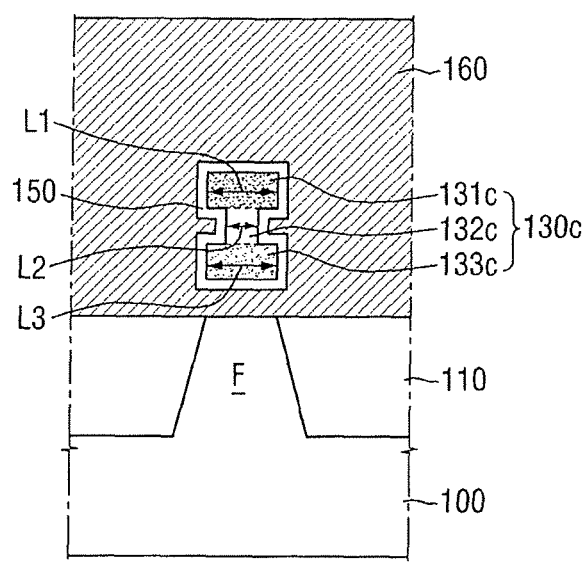
FIG. 7 is a cross-sectional view of a semiconductor device according to an exemplary embodiment of the present inventive concept.

FIG. 7 is a cross-sectional view of a semiconductor device according to an exemplary embodiment of the present inventive concept. Descriptions of elements substantially identical to those of the previous exemplary embodiments may be omitted. The current exemplary embodiment of the present inventive concept may be described hereinafter focusing on differences from the previous exemplary embodiments of the present inventive concept.

Referring to FIG. 7, an active layer 130c of a semiconductor device 3 according to an exemplary embodiment of the present inventive concept may have a different structure from the active layer 130a of the semiconductor device 1 described above.

Widths L1 or L3 of an upper region 131c or a lower region 133c of the active layer 130c measured in a second direction intersecting a first direction in which the gate electrode 160 extends may be greater than a width L2 of a middle region 132c measured in the second direction. The width L2 of the middle region 132c may be smaller than the width L1 or L3 of the upper region 131c or the lower region 133c. The width L1 of the upper region 131c may be equal to the width L3 of the lower region 133c, but the present inventive concept is not limited thereto.

The active layer 130c may be disposed separately from the fin F. The gate electrode 160 and the gate insulating layer 150 may be disposed between the active layer 130c and the fin F. The gate insulating layer 150 may be conformally disposed along the active layer 130c.

Three different surfaces of each of the upper region 131c and the lower region 133c of the active layer 130c may face the gate electrode 160. Side surfaces of the middle region 132c of the active layer 130c may face the gate electrode 160.

The concentration of germanium in the upper region 131c or the lower region 133c of the active layer 130c may be higher than the germanium concentration in the middle region 132c disposed between the upper region 131c and the lower region 133c of the active layer 130c. For example, the concentration of germanium in the upper region 131c or the lower region 133c may be higher than the germanium concentration in the middle region 132c by 25% or more, but the present inventive concept is not limited thereto. The middle region 132c may serve as an SRB and may increase the operating current capability of a third transistor TR3.

Figure 8:
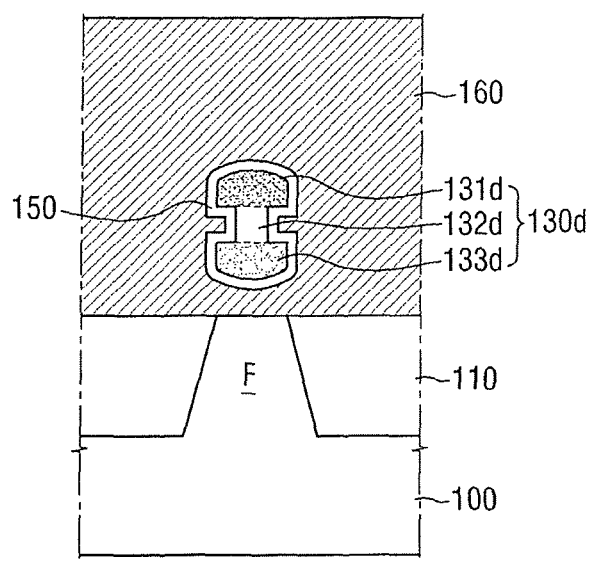
FIG. 8 is a cross-sectional view of a semiconductor device according to an exemplary embodiment of the present inventive concept.

FIG. 8 is a cross-sectional view of a semiconductor device according to an exemplary embodiment of the present inventive concept. Descriptions of elements substantially identical to those of the previous exemplary embodiments may be omitted. The current exemplary embodiment of the present inventive concept may be described hereinafter focusing on differences from the previous exemplary embodiments of the present inventive concept.

Referring to FIG. 8, an active layer 130d of a semiconductor device 4 according to an exemplary embodiment of the present inventive concept may have a different structure from the active layer 130c of the semiconductor device 3 described above.

A cross-section of the active layer 130d may have an elliptical shape. Outer surfaces of each of an upper region 131d and a lower region 133d of the active layer 130d may be curved. Side surfaces of a middle region 132d of the active layer 130d may face the gate electrode 160.

A width of the upper region 131d or the lower region 133d of the active layer 130d measured in a second direction intersecting a first direction in which the gate electrode 160 extends may be greater than a width of the middle region 132d measured in the second direction. The width of the middle region 132d may be smaller than the width of the upper region 131d or the lower region 133d. The concentration of germanium in the upper region 131d or the lower region 133d of the active layer 130d may be higher than the germanium concentration in the middle region 132d disposed between the upper region 131d and the lower region 133d of the active layer 130d.

Figure 9:
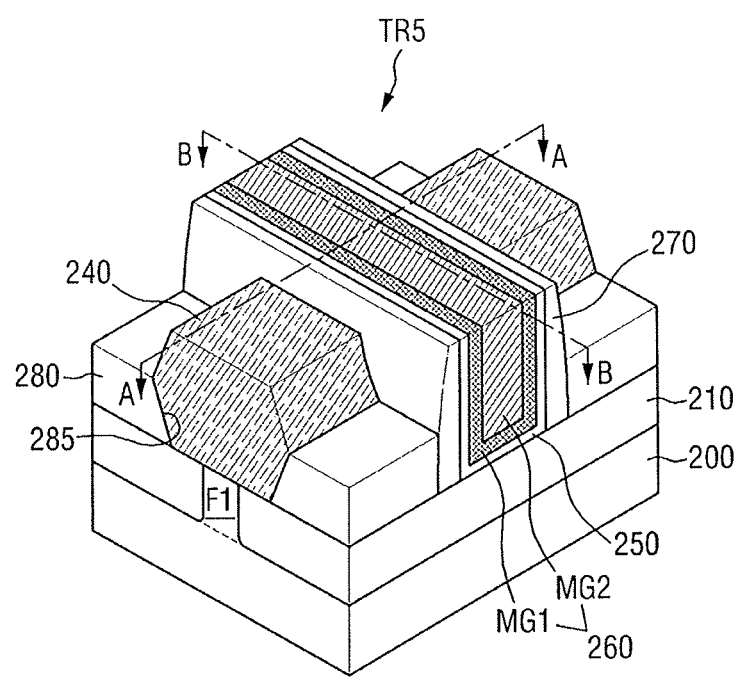
FIG. 9 is a perspective view of a semiconductor device according to an exemplary embodiment of the present inventive concept.
Figure 10:
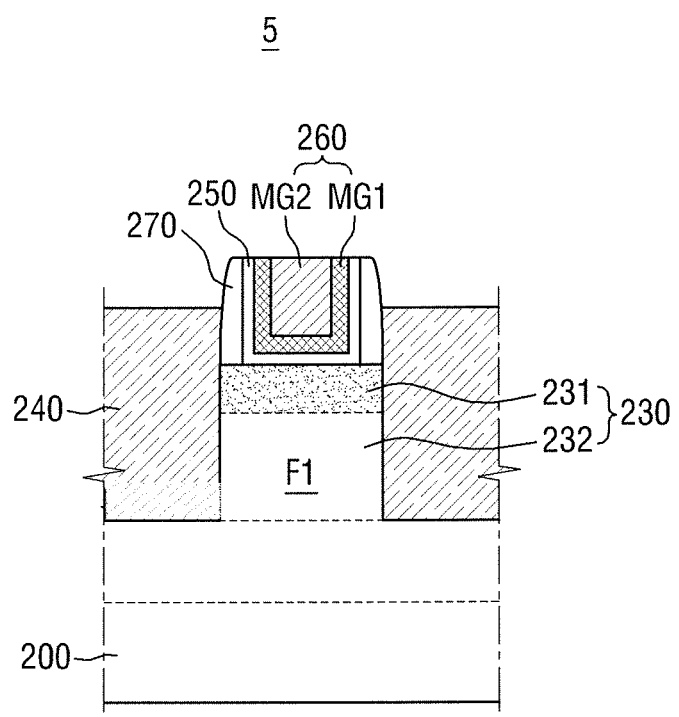
FIG. 10 is a cross-sectional view taken along line A-A of FIG. 9.
Figure 11:
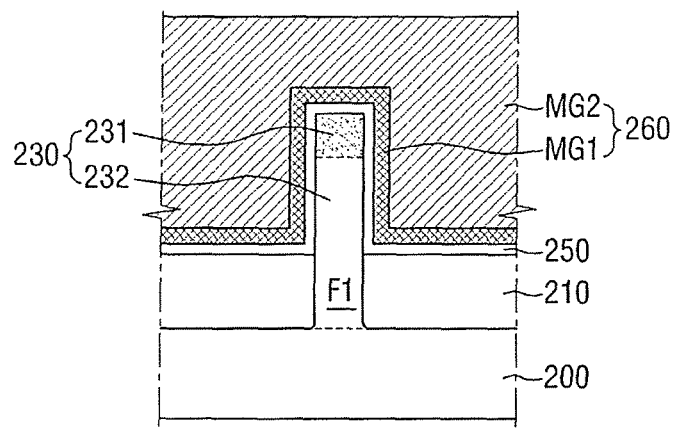
FIG. 11 is a cross-sectional view taken along line B-B of FIG. 9.

FIG. 9 is a perspective view of a semiconductor device according to an exemplary embodiment of the present inventive concept. FIG. 10 is a cross-sectional view taken along line A-A of FIG. 9. FIG. 11 is a cross-sectional view taken along line B-B of FIG. 9. Descriptions of elements substantially identical to those of the previous exemplary embodiments may be omitted. The current exemplary embodiment of the present inventive concept may be described hereinafter focusing on differences from the previous exemplary embodiments of the present inventive concept.

Referring to FIGS. 9 through 11, a semiconductor device 5 may include a substrate 200, a fin Fl, a device isolation layer 210, an active layer 230, source or drain regions 240, a gate insulating layer 250, and a gate electrode 260.

The fin F may be disposed on the substrate 200 along a first direction. The fin F1 may include a first region 231 and a second region 232. The second region 232 may be closer to the substrate 200 than the first region 231. The concentration of germanium in the first region 231 may be higher than the concentration of germanium in the second region 232.

Although not specifically illustrated in the drawings, the first region 231 may include a first sub-region and a second sub-region. The first sub-region may be disposed adjacent to the substrate 200, and the second sub-region may be disposed farther from the substrate 200 than the first sub-region. The concentration of germanium in the first sub-region may be lower than the concentration of germanium in the second sub-region. The concentration of germanium may gradually increase toward an end of the fin F1.

Although not specifically illustrated in the drawings, a width of the first region 231 measured in a second direction intersecting a first direction in which the gate electrode 260 extends may be greater than a width of the second region 232 measured in the second direction. An upper portion of the fin Fl disposed on the substrate 200 may be wider than a lower portion thereof. The fin F1 may have a tapered cross-sectional shape and may become wider from the top toward the bottom, but the present inventive concept is not limited thereto.

The gate insulating layer 250 and the gate electrode 260 may be disposed on the fin F1 and may partially cover the fin F1 along the second direction.

The source or drain regions 240 may be disposed on the fin Fl and may be located on at least one side of the gate electrode 260.

Spacers 270 may be disposed on at least one side of the gate electrode 260, and the source or drain regions 240 may be separated from the gate electrode 260 by the spacers 270. The spacers 270 may be disposed on sidewalls of the gate electrode 260 and sidewalls of the fin F1. For example, an insulating layer may be disposed on a structure including the gate electrode 260. An etch-back process may be performed to form the spacers 270. Each of the spacers 270 may include, but is not limited to, a silicon nitride layer or a silicon oxynitride layer. A side surface of each of the spacers 270 may be curved. However, the present inventive concept is not limited thereto, and the shape of the spacers 270 may be changed as desired. For example, in some exemplary embodiments of the present inventive concept, the shape of the spacers 270 may be an 'I' shape or an 'L' shape.

If the semiconductor device 5 is formed by a replacement process (or a gate last process), the gate insulating layer 250 may be formed to extend upward along sidewalls of the spacers 270.

The gate insulating layer 250 may include a high-k material having a higher dielectric constant than a silicon oxide layer. For example, the gate insulating layer 250 may include $HfO_2$, $ZrO_2$, or $Ta_2O_5$. The gate insulating layer 250 may be disposed substantially conformally along sidewalls and a bottom surface of a trench.

The gate electrode 260 may include metal layers (e.g., MG1 and MG2). The gate electrode 260 may be formed by stacking two or more metal layers (e.g., MG1 and MG2). A first metal layer MG1 may control a work function, and a second metal layer MG2 may fill a space formed by the first metal layer MG1. For example, the first metal layer MG1 may include at least one of TiN, TaN, TiC, and TaC. The second metal layer MG2 may include W or Al. The gate electrode 260 may include a material (e.g., Si or SiGe) other than a metal.

Figure 12:
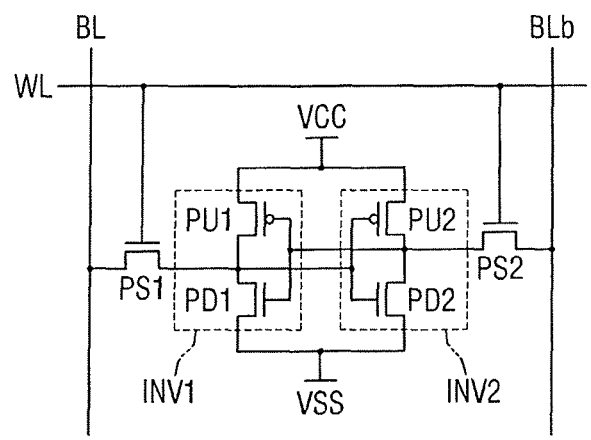
FIG. 12 is a circuit diagram of a semiconductor device according to exemplary embodiments of the present inventive concept.
Figure 13:
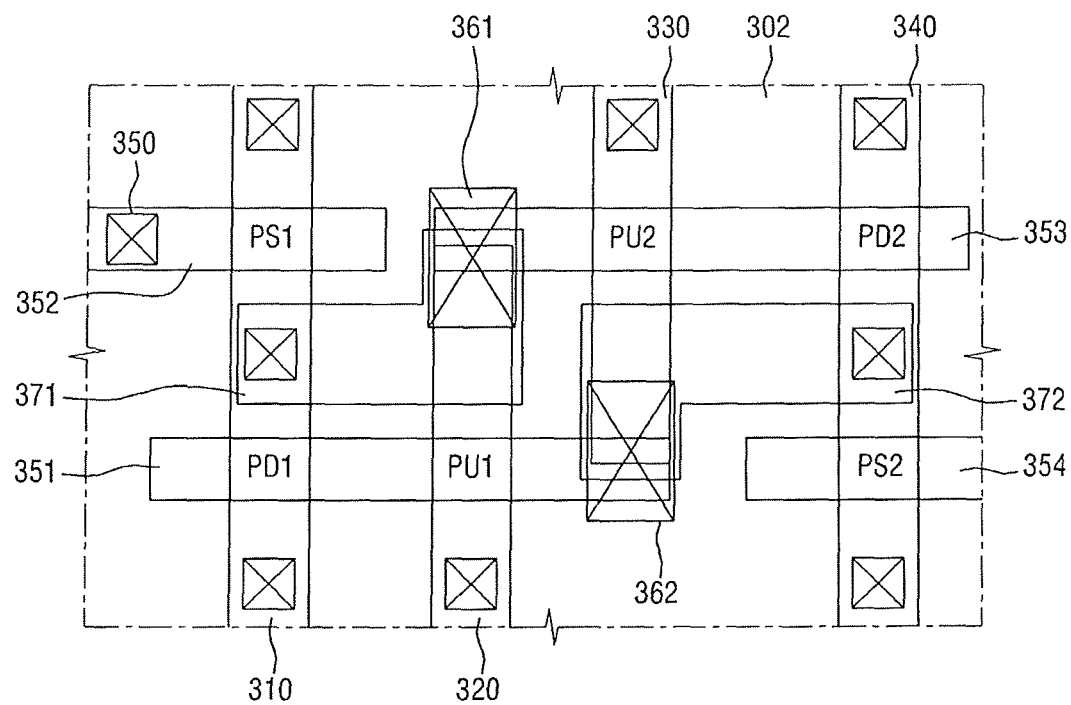
FIG. 13 is a layout diagram of the semiconductor device of FIG. 12.

FIG. 12 is a circuit diagram of a semiconductor device according to exemplary embodiments of the present inventive concept. FIG. 13 is a layout diagram of the semiconductor device 10 of FIG. 12. Descriptions of elements substantially identical to those of the previous exemplary embodiments may be omitted. The current exemplary embodiment of the present inventive concept may be described hereinafter focusing on differences from the previous exemplary embodiments of the present inventive concept.

Referring to FIGS. 12 and 13, a semiconductor device 10 may include a first inverter INV1 and a second inverter INV2. The first and second inverters INV1 and INV2 may be connected in parallel between a power source node VCC and a ground node VSS. First and second pass transistors PS1 and PS2 may be respectively connected to output nodes of the first and second inverters INV1 and INV2. The first and second pass transistors PS1 and PS2 may be connected to a bit line BL and a complementary bit line BLb, respectively. Gates of the first and second pass transistors PS1 and PS2 may be connected to a word line WL.

The first inverter INV1 may include a first pull-up transistor PU1 and a first pull-down transistor PD1. The first pull-up transistor PU1 and the first pull-down transistor PD1 may be connected in series. The second inverter INV2 may include a second pull-up transistor PU2 and a second pull-down transistor PD2. The second pull-up transistor PU2 and the second pull-down transistor PD2 may be connected in series. The first and second pull-up transistors PU1 and PU2 may be p-channel field effect transistors (PFETs), and the first and second pull-down transistors PD1 and PD2 may be n-channel field effect transistors (NFETs).

An input node of the first inverter INV1 may be connected to the output node of the second inverter INV2. An input node of the second inverter INV2 may be connected to the output node of the first inverter INV1. The first and second inverters INV1 and INV2 may form a single latch circuit.

Referring again to FIGS. 12 and 13, a first active fin 310, a second active fin 320, a third active fin 330 and a fourth active fin 340 may extend in a first direction (e.g., a vertical direction in FIG. 13) and may be separated from each other. The second active fin 320 and the third active fin 330 may be shorter than the first active fin 310 and the fourth active fin 340. The first active fin 310, the second active fin 320, the third active fin 330 and the fourth active fin 340 may be disposed on a substrate 302.

A first gate electrode 351, a second gate electrode 352, a third gate electrode 353, and a fourth gate electrode 354 may extend in a second direction (e.g., a horizontal direction in FIG. 13) and may intersect the first through fourth active fins 310 through 340. The first gate electrode 351 may completely intersect the first active fin 310 and the second active fin 320 and may partially overlap an end of the third active fin 330. The third gate electrode 353 may completely intersect the fourth active fin 340 and the third active fin 330 and may partially overlap an end of the second active fin 320. The second gate electrode 352 and the fourth gate electrode 354 may intersect the first active fin 310 and the fourth active fin 340, respectively.

The first pull-up transistor PU1 may be disposed near the intersection of the first gate electrode 351 and the second active fin 320. The first pull-down transistor PD1 may be disposed near the intersection of the first gate electrode 351 and the first active fin 310. The first pass transistor PS1 may be disposed near the intersection of the second gate electrode 352 and the first active fin 310. The second pull-up transistor PU2 may be disposed near the intersection of the third gate electrode 353 and the third active fin 330. The second pull-down transistor PD2 may be disposed near the intersection of the third gate electrode 353 and the fourth active fin 340. The second pass transistor PS2 may be disposed near the intersection of the fourth gate electrode 354 and the fourth active fin 340.

Although not specifically illustrated in the drawings, source and drain regions may be disposed on sides of each of the intersections between the first through fourth gate electrodes 351 through 354 and the first through fourth active fins 310 through 340, respectively. A plurality of contacts 350 may be disposed in the regions of the first through fourth gate electrodes 351 through 354 and the first through fourth active fins 310 through 340.

A first shared contact 361 may connect the second active fin 320, the third gate electrode 353, and wiring 371. A second shared contact 362 may connect the third active fin 330, the first gate electrode 351, and wiring 372.

The semiconductor device 10 may be included in, e.g., a static random access memory (SRAM). At least one transistor (e.g., PU1 and PU2, PD1 and PD2, and PS1 and PS2) included in the semiconductor device 10 may employ the configuration according to an exemplary embodiment of the present inventive concept. For example, the first and second pull-up transistors PU1 and PU2, the first and second pass transistors PS1 and PS2, or the first and second pull-down transistors PD1 and PD2 illustrated in FIG. 11 may be configured according to the transistors TR1 through TR5 illustrated in FIGS. 1 through 11.

Figure 14:
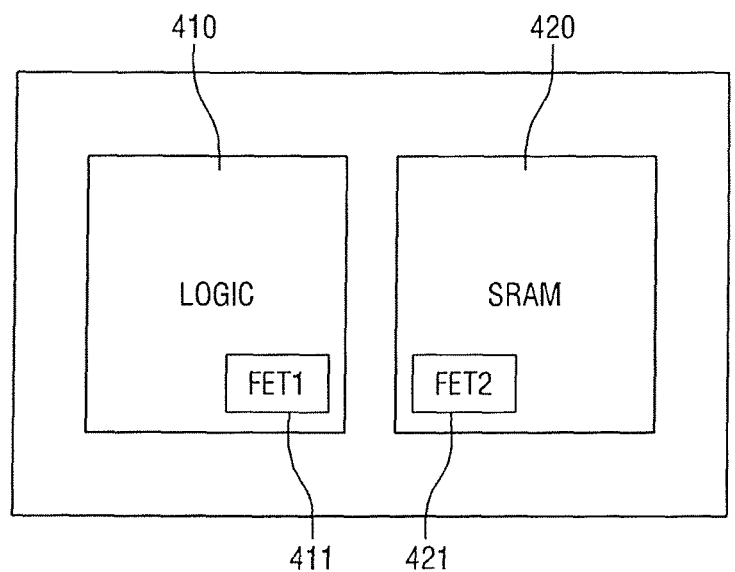
FIG. 14 is a block diagram of a semiconductor device according to exemplary embodiments of the present inventive concept.
Figure 15:
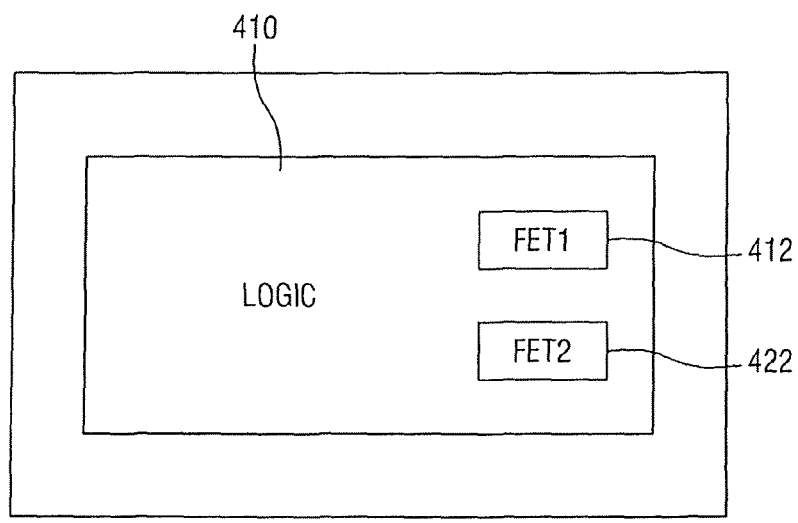
FIG. 15 is a block diagram of a semiconductor device according to exemplary embodiments of the present inventive concept.

FIG. 14 is a block diagram of a semiconductor device according to exemplary embodiments of the present inventive concept. FIG. 15 is a block diagram of a semiconductor device according to exemplary embodiments of the present inventive concept.

Referring to FIG. 14, the semiconductor device 13 may include a logic region 410 and an SRAM region 420. An eleventh transistor 411 may be disposed in the logic region 410, and a twelfth transistor 421 may be disposed in the SRAM region 420.

In some exemplary embodiments of the present inventive concept, the eleventh transistor 411 and the twelfth transistor 421 may have different conductivity types from each other, but the present inventive concept is not limited thereto.

Referring to FIG. 15, the semiconductor device 14 may include the logic region 410. Thirteenth and fourteenth transistors 412 and 422 which may be different from each other may be disposed in the logic region 410. Although not specifically illustrated in the drawing, the thirteenth and fourteenth transistors 412 and 422 may be disposed in the SRAM region.

In some exemplary embodiments of the present inventive concept, the thirteenth transistor 412 and the fourteenth transistor 422 may have different conductivity types from each other.

In some exemplary embodiments of the present inventive concept, the thirteenth transistor 412 and the fourteenth transistor 422 may have the same conductivity type as each other. The first transistor TR1 illustrated in FIG. 1 may be employed as the thirteenth transistor 412, and the second transistor TR2 illustrated in FIG. 4 may be employed as the fourteenth transistor 422. However, the present inventive concept is not limited thereto.

In FIG. 15, the logic region 410 is illustrated as an example, but the present inventive concept is not limited to this example. Exemplary embodiments of the present inventive concept may also be applied the logic region 410 and a region where another memory (e.g., DRAM, MRAM, RRAM, or PRAM) is formed.

Figure 16:
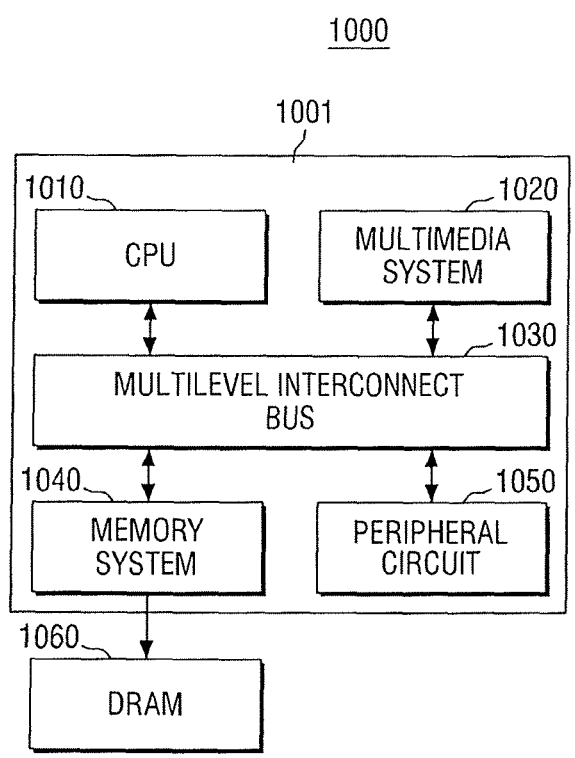
FIG. 16 is a block diagram of a system-on-chip (SoC) system including semiconductor devices according to exemplary embodiments of the present inventive concept.

FIG. 16 is a block diagram of a system-on-chip (SoC) system including semiconductor devices according to exemplary embodiments of the present inventive concept.

Referring to FIG. 16, a SoC system 1000 may include an application processor 1001 and a dynamic random access memory (DRAM) 1060.

The application processor 1001 may include a central processing unit (CPU) 1010, a multimedia system 1020, a multilevel interconnect bus 1030, a memory system 1040, and a peripheral circuit 1050.

The CPU 1010 may perform operations needed to drive the SoC system 1000. In some exemplary embodiments of the present inventive concept, the CPU 1010 may be configured as a multi-core environment including a plurality of cores.

The multimedia system 1020 may be used to perform various multimedia functions in the SoC system 1000. The multimedia system 1020 may include a 3D engine module, a video codec, a display system, a camera system, and a post-processor.

The bus 1030 may be used for data communication among the CPU 1010, the multimedia system 1020, the memory system 1040 and the peripheral circuit 1050. In some exemplary embodiments of the present inventive concept, the bus 1030 may have a multilayer structure. Specifically, the multilevel interconnect bus 1030 may be, but is not limited to, a multilayer advanced high-performance bus (AHB) or a multilayer advanced extensible interface (AXI).

The memory system 1040 may provide an environment for the application processor 1001 to be connected to an external memory (e.g., the DRAM 1060) and operate at high speed. In some exemplary embodiments of the present inventive concept, the memory system 1040 may include a controller (e.g., a DRAM controller) for controlling the external memory (e.g., the DRAM 1060).

The peripheral circuit 1050 may provide an environment for the SoC system 1000 to connect to an external device (e.g., a mainboard). Accordingly, the peripheral circuit 1050 may include various interfaces that enable the external device connected to the SoC system 1000 to be compatible with the SoC system 1000.

The DRAM 1060 may function as an operating memory for the operation of the application processor 1001. In some exemplary embodiments of the present inventive concept, the DRAM 1060 may be disposed outside the application processor 1001. The DRAM 1060 may be packaged with the application processor 1001 in the form of a package on package (PoP).

At least one of the elements of the SoC system 1000 may employ any one of the semiconductor devices 1 through 5 according to the above-described exemplary embodiments of the present inventive concept.

Figure 17:
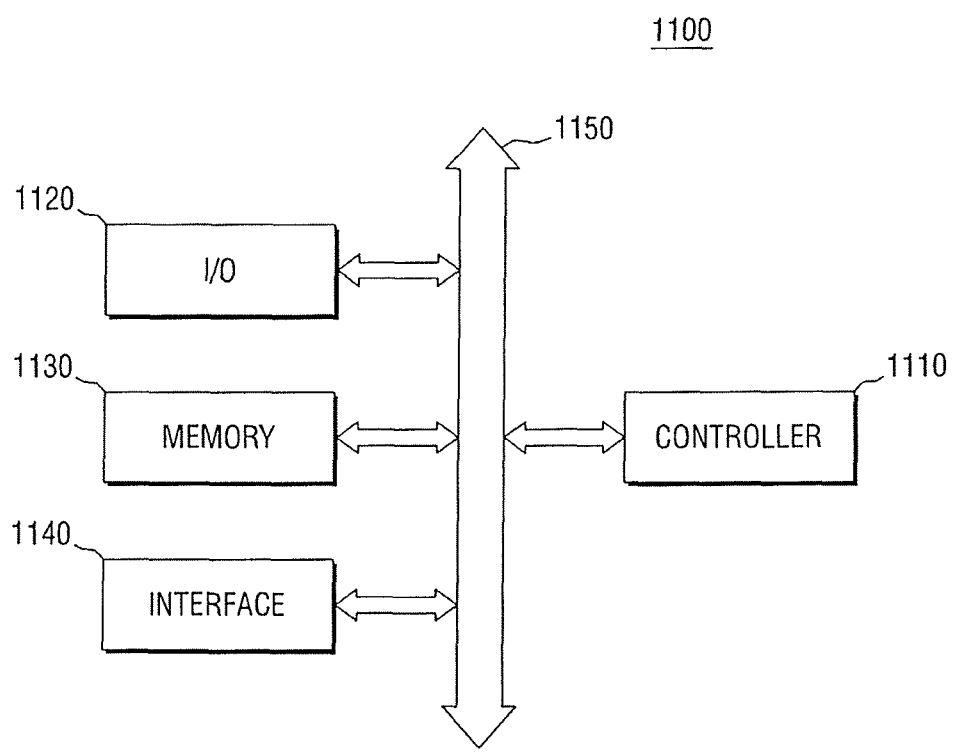
FIG. 17 is a block diagram of an electronic system including semiconductor devices according to exemplary embodiments of the present inventive concept.

FIG. 17 is a block diagram of an electronic system including semiconductor devices according to exemplary embodiments of the present inventive concept.

Referring to FIG. 17, the electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may be a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 1140 may transmit data to or receive data from a communication network. The interface 1140 may be a wired or wireless interface. According to an exemplary embodiment of the present inventive concept, the interface 1140 may include an antenna or a wired or wireless transceiver.

Although not illustrated in the drawing, the electronic system 1100 may be an operating memory operating the controller 1110, and may include a high-speed DRAM or SRAM. Any one of the semiconductor devices 1 through 5 according to the above-described exemplary embodiments of the present inventive concept may be employed as the operating memory. Any one of the semiconductor devices 1 through 5 according to the above-described exemplary embodiments of the present inventive concepts may be included in the memory device 1130 or in the controller 1110 or the I/O device 1120.

The electronic system 1100 may be applied to nearly all types of electronic products capable of transmitting and/or receiving information (e.g., in a wireless environment), such as a personal data assistant (PDA), a portable computer, a web tablet, a wireless phone, a mobile phone, a digital music player, or a memory card.

Figure 18:
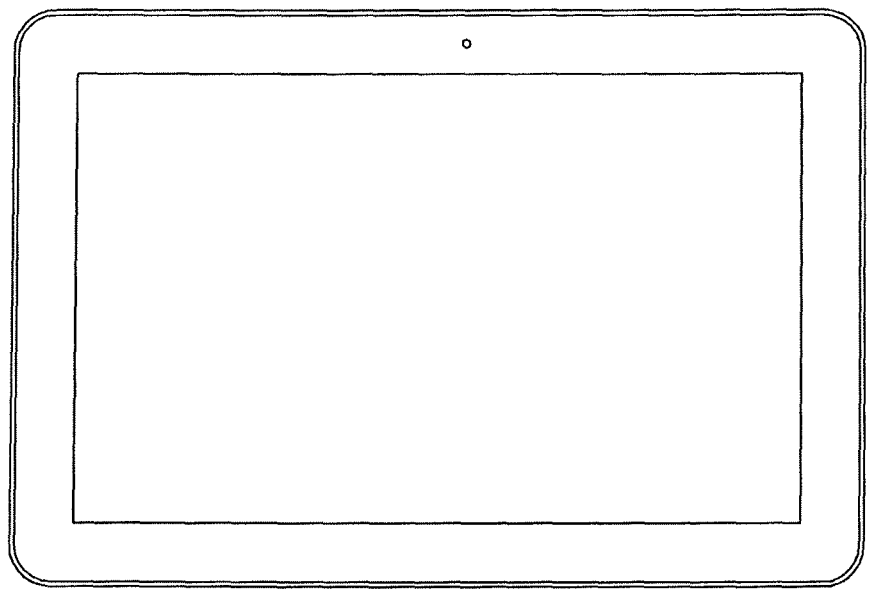
FIGS. 18 through 20 are diagrams illustrating examples of a semiconductor system to which semiconductor devices according to exemplary embodiments of the present inventive concept may be applied.
Figure 19:
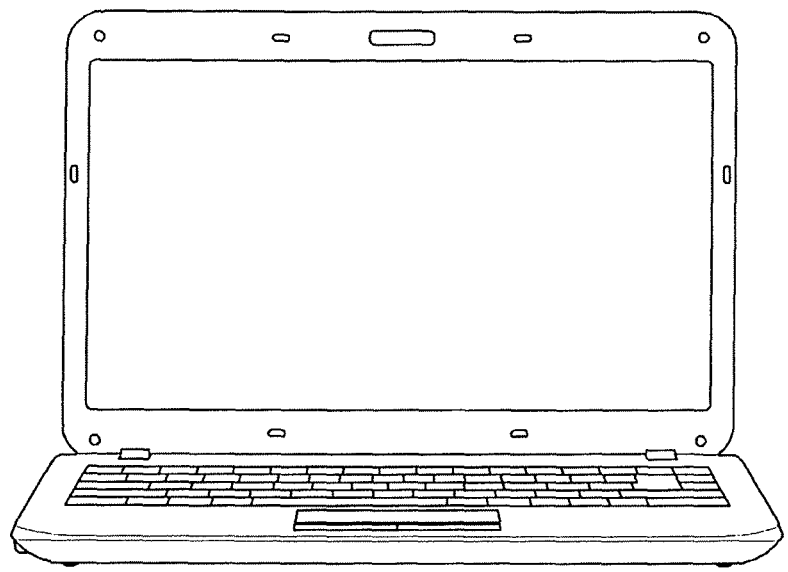
Figure 20:
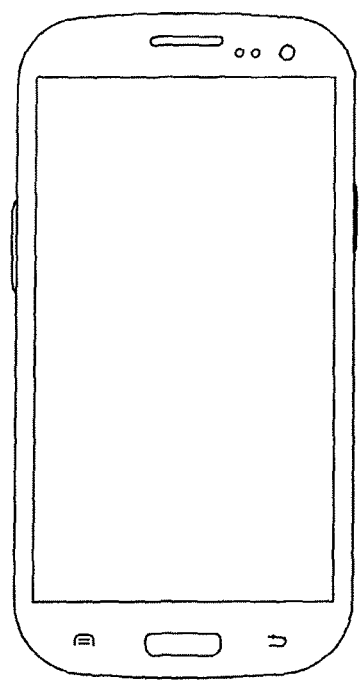

FIGS. 18 through 20 are diagrams illustrating examples of a semiconductor system to which semiconductor devices according to exemplary embodiments of the present inventive concept may be applied.

FIG. 18 illustrates a tablet personal computer (PC) 1200, FIG. 19 illustrates a notebook computer 1300, and FIG. 20 illustrates a smartphone 1400. At least one of the semiconductor devices 1 through 5 according to exemplary embodiments of the present inventive concept may be used in the tablet PC 1200, the notebook computer 1300, and/or the smartphone 1400.

The semiconductor devices 1 through 5 according to exemplary embodiments of the present inventive concept may also be applied to various devices other than those set forth herein. While the tablet PC 1200, the notebook computer 1300, and the smartphone 1400 have been described above as examples of a semiconductor system according to an exemplary embodiment of the present inventive concept, the examples of the semiconductor system according to the exemplary embodiments are not limited to the tablet PC 1200, the notebook computer 1300, and the smartphone 1400. In some exemplary embodiments of the present inventive concept, the semiconductor system may be used in a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, or a digital video player.

Methods of fabricating a semiconductor device according to exemplary embodiments of the present inventive concept will now be described in more detail below with reference to FIGS. 21 through 39.

FIGS. 21 through 27 are diagrams illustrating a method of fabricating a semiconductor device according to an exemplary embodiment of the present inventive concept.

Figure 21:
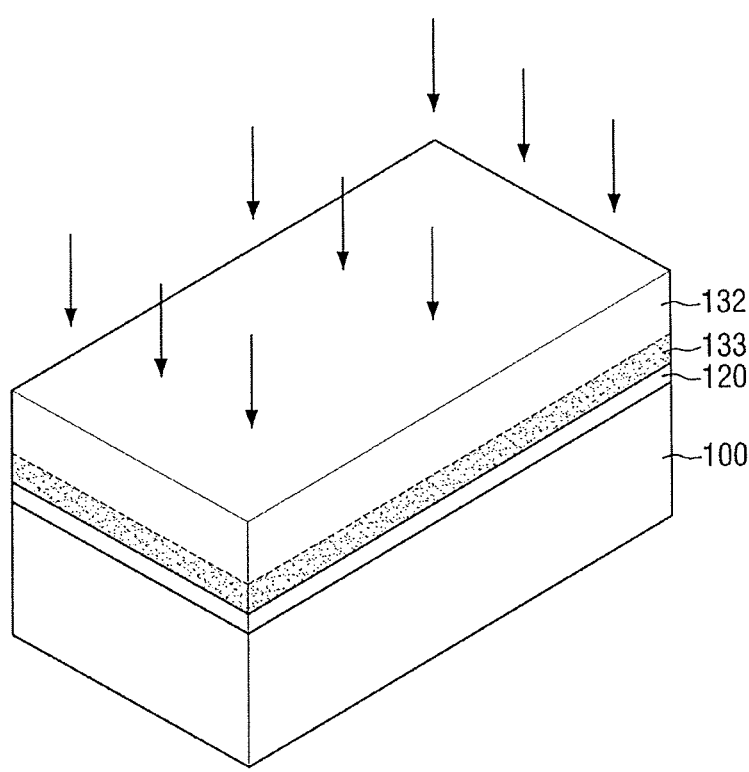
FIGS. 21 through 27 are diagrams illustrating a method of fabricating a semiconductor device according to an exemplary embodiment of the present inventive concept.
Figure 22:
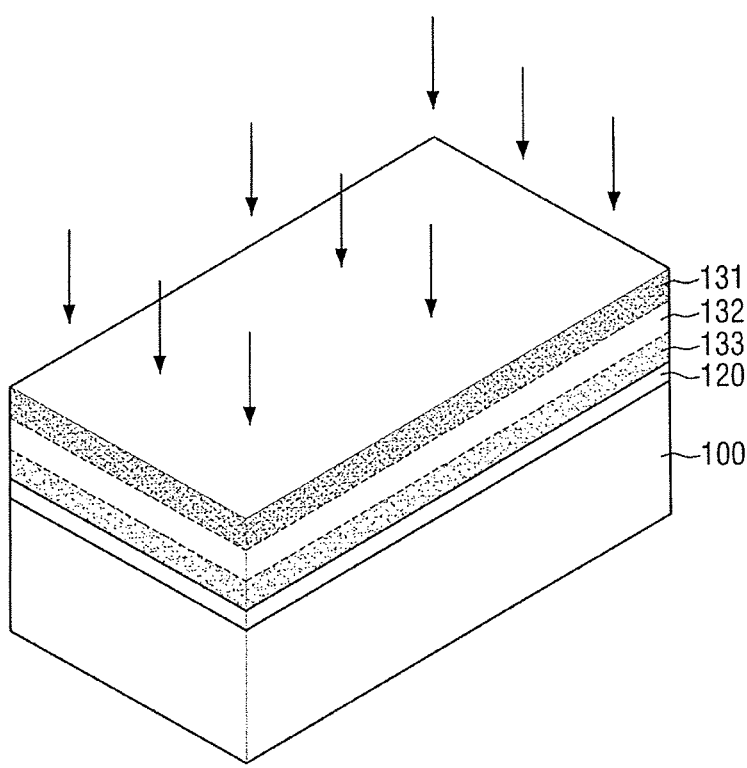

Referring to FIG. 21, a sacrificial layer 120 may be formed on the substrate 100. A first epitaxial layer 133 may be formed on the sacrificial layer 120. The first epitaxial layer 133 may be formed by, e.g., an epitaxial growth process. The first epitaxial layer 133 may include, for example, silicon germanium (SiGe). A second epitaxial layer 132 may be formed on the first epitaxial layer 133. The second epitaxial layer 132 may be formed by, e.g., an epitaxial growth process. The second epitaxial layer 132 may include, e.g., silicon (Si) or silicon germanium (SiGe). Since the first epitaxial layer 133 and the second epitaxial layer 132 may have similar lattice structures, the second epitaxial layer 132 may grow well on the first epitaxial layer 133.

Referring to FIS. 21 and 22, an oxidation process for germanium condensation may be performed on the second epitaxial layer 132. The oxidation process may cause germanium to be pushed to an upper end of the second epitaxial layer 132, thereby forming a third epitaxial layer 131 with a relatively high concentration of germanium.

In the process of forming the third epitaxial layer 131, silicon oxide ($SiO_2$) may be deposited on the third epitaxial layer 131. When the silicon oxide is removed, the sacrificial layer 120, the first epitaxial layer 133, the second epitaxial layer 132, and the third epitaxial layer 131 may be formed sequentially on the substrate 100. The concentration of germanium in the first epitaxial layer 133 and the third epitaxial layer 131 may be relatively higher than the concentration of germanium in the second epitaxial layer 132. For example, the concentration of germanium in the first epitaxial layer 133 and the third epitaxial layer 131 may be higher than the concentration of germanium in the second epitaxial layer 132 by 25% or more, but the present inventive concept is not limited thereto.

Figure 23:
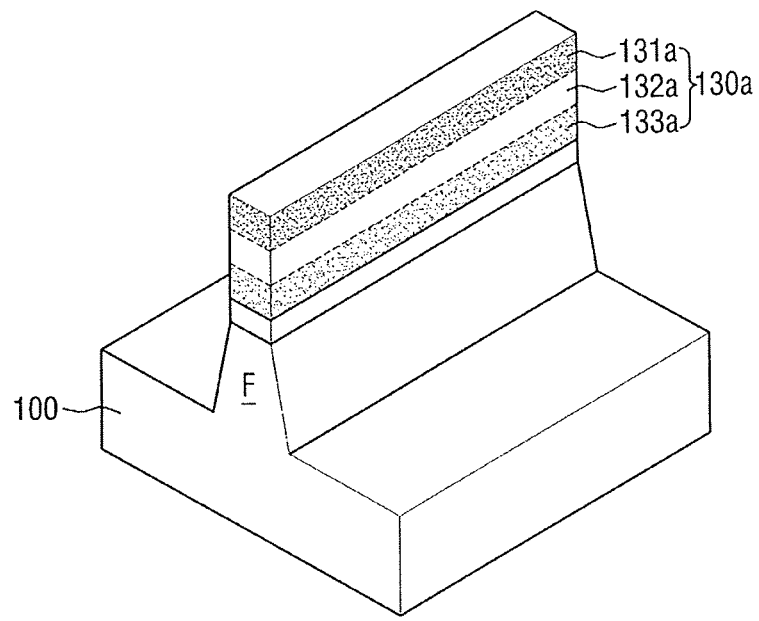

Referring to FIG. 23, the third epitaxial layer 131, the second epitaxial layer 132, the first epitaxial layer 133, the sacrificial layer 120, and the substrate 100 may be etched. The etching of the third epitaxial layer 131, the second epitaxial layer 132, the first epitaxial layer 133, the sacrificial layer 120, and the substrate 100 may be performed sequentially. The etching of the first through third epitaxial layers 133 through 131 may form the active layer 130a, and the etching of an upper portion of the substrate 100 may form the fin F. A device isolation layer 110 may be formed covering the fin F.

According to exemplary embodiments of the present inventive concept, a method of forming the fin F, the sacrificial layer 120, and the active layer 130a is not limited to the above method. In some exemplary embodiments of the present inventive concept, the fin F, the sacrificial layer 120 and the active layer 130a may be formed using a different method. For example, a fourth epitaxial layer including silicon may be formed on the substrate 100, which may include an insulating material. A fifth epitaxial layer including silicon germanium may be formed on the fourth epitaxial layer. A sixth epitaxial layer including silicon may be formed on the fifth epitaxial layer.

The sixth epitaxial layer, the fifth epitaxial layer, and the fourth epitaxial layer may be etched sequentially. The etching of the sixth epitaxial layer may form the active layer 130a, the etching of the fifth epitaxial layer may form the sacrificial layer 120, and the etching of the fourth epitaxial layer may form the fin F. Accordingly, a SOI structure may be formed (e.g., the SOI structure illustrated in FIG. 6).

Figure 24:
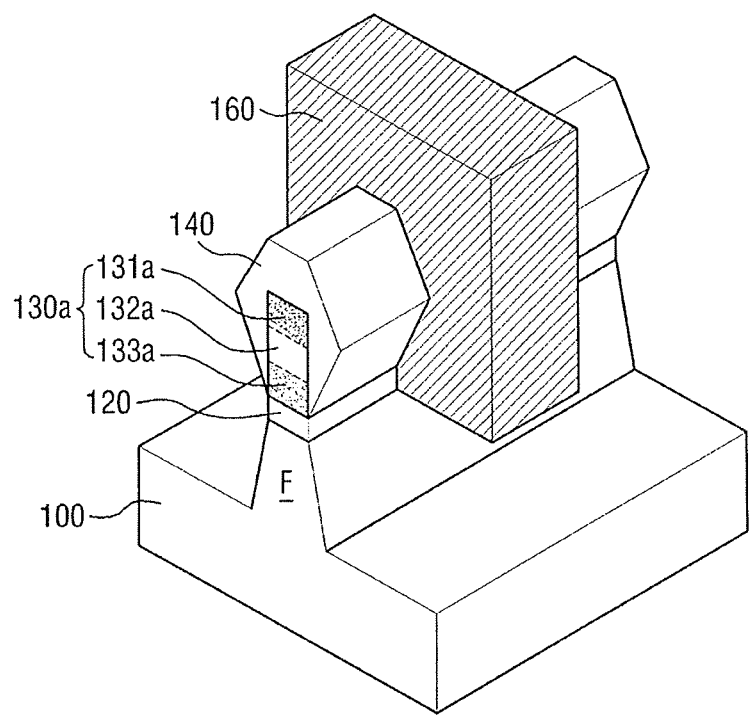

Referring to FIG. 24, a dummy gate 160 may be formed covering the sacrificial layer 120 and the active layer 130a. In some exemplary embodiments of the present inventive concept, the dummy gate 160 may include, for example, polysilicon (poly-Si). Source or drain regions 140 may be formed on opposite sides of the dummy gate 160. In some exemplary embodiments of the present inventive concept, the source or drain regions 140 may be formed on two sides of the dummy gate 160 using an epitaxial growth process. Accordingly, the source or drain regions 140 may be formed higher than the sacrificial layer 120, as illustrated in FIG. 24, for example.

While the source or drain regions 140 may be formed by an epitaxial growth process, the present inventive concept is not limited thereto. In some exemplary embodiments of the present inventive concept, the source or drain regions 140 may be formed in the active layer 130a disposed on two sides of the dummy gate 160 by an IIP process. In some exemplary embodiments of the present inventive concept, the source or drain regions 140 may be formed in a trench of the active layer 130a disposed on two sides of the dummy gate 160. The trench may be formed by partially etching the active layer 130a disposed on two sides of the dummy gate 160, and the source or drain regions 140 may be formed in the trench by, e.g., an epitaxial growth process.

Figure 25:
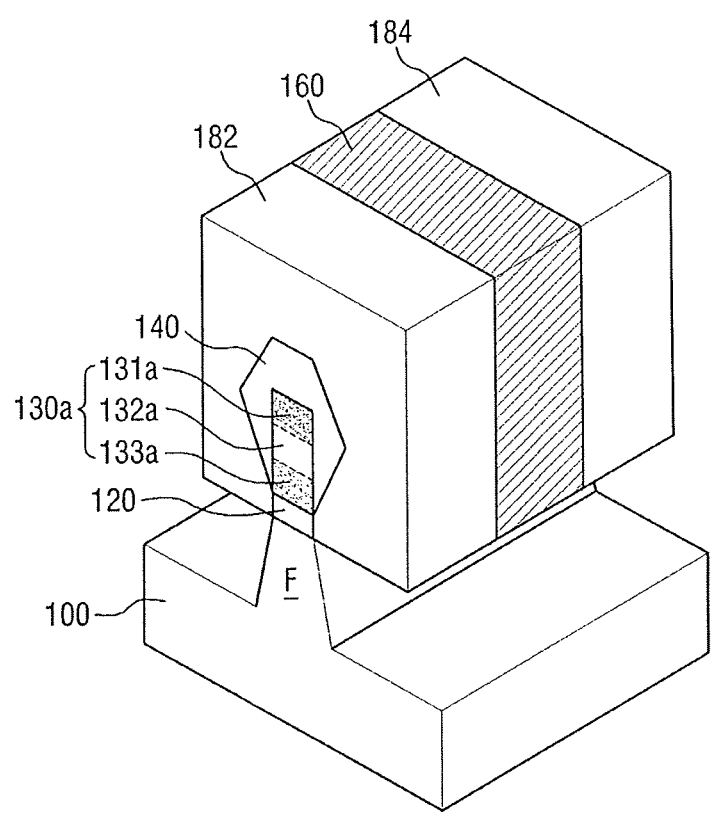

Referring to FIG. 25, interlayer insulating films 182 and 184 may be formed covering the source or drain regions 140. An insulating layer may be formed covering the source or drain regions 140 and the dummy gate 160 and the insulating layer may then be etched to expose a top surface of the dummy gate 160. As a result, the interlayer insulating films 182 and 184 may be formed.

In some exemplary embodiments of the present inventive concept, the interlayer insulating films 182 and 184 may include, but are not limited to, an oxide layer or an oxynitride layer.

Figure 26:
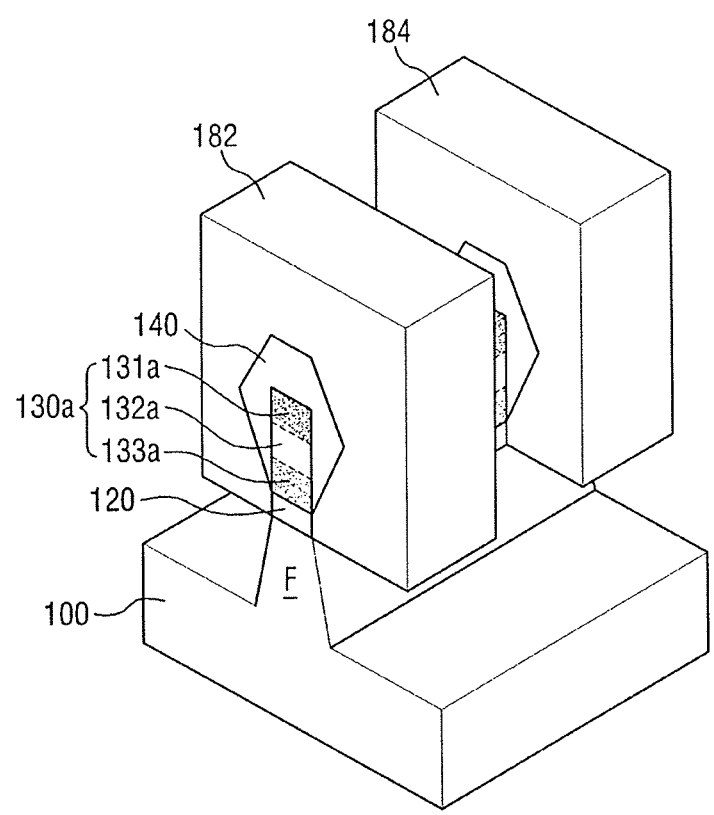

Referring to FIG. 26, the exposed dummy gate 160 may be removed by etching. In some exemplary embodiments of the present inventive concept, the exposed dummy gate 160 may be etched twice. The exposed dummy gate 160 may be etched using a dry etch process. Then, the remaining dummy gate 160 may be etched again using a wet etch process. Accordingly, the whole dummy gate 160 may be removed, thereby exposing the active layer 130a and the sacrificial layer 120.

Figure 27:
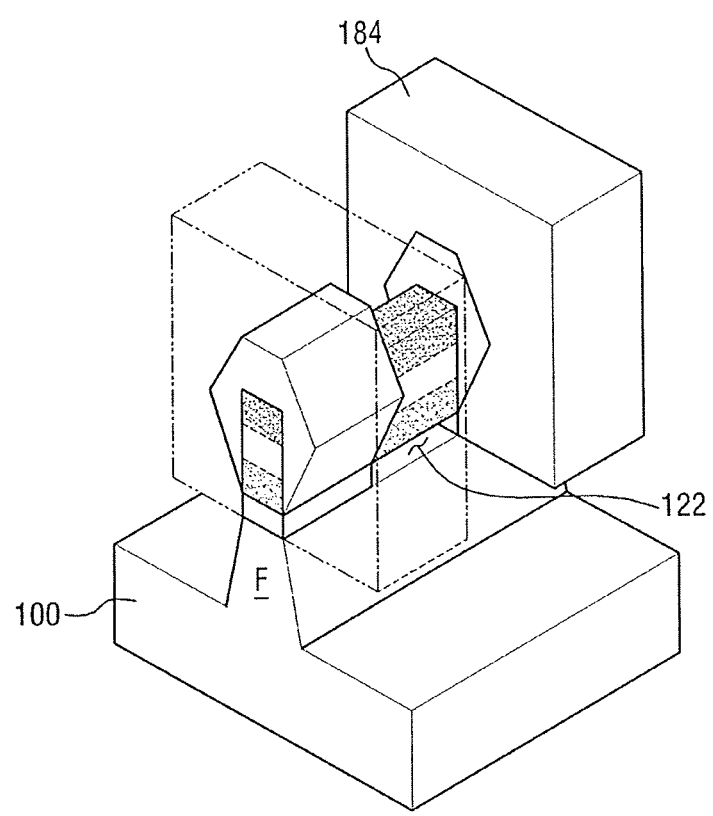

Referring to FIGS. 26 and 27, the exposed sacrificial layer 120 may be etched. The sacrificial layer 120 under the exposed active layer 130a may be removed. For example, the sacrificial layer 120 may be removed by using variability in etch selectivities of the active layer 130a and the sacrificial layer 120. In FIG. 27, the active layer 130a and the sacrificial layer 120 of FIG. 26 are highlighted.

In an exemplary embodiment of the present inventive concept, the sacrificial layer 120 may include, e.g., silicon. If the proportion of germanium in the active layer 130a is higher than the proportion of silicon, the etch selectivity of silicon included in the sacrificial layer 120 may increase. Therefore, the sacrificial layer 120 disposed under the exposed active layer 130a can be removed by performing a wet etch process using hydrochloric acid (HCl). This partial removing of the sacrificial layer 120 may produce a through hole 122 that penetrates the sacrificial layer 120.

Referring to FIGS. 1 through 3, the gate insulating layer 150 may be formed completely covering the exposed active layer 130a (see, e.g., FIG. 27). The gate insulating layer 150 may penetrate the sacrificial layer 120 and may completely cover top, side and bottom surfaces of the active layer 130a. Then, a gate electrode 160 may be formed on the gate insulating layer 150. The gate electrode 160 may penetrate the sacrificial layer 120 and may completely cover the top, side and bottom surfaces of the active layer 130a. Accordingly, the semiconductor device 1 illustrated in FIGS. 1 through 3 may be fabricated.

In the above-described fabrication method, if the active layer 130a is etched such that a cross-section thereof has an elliptical shape, the semiconductor device 2 illustrated in FIGS. 4 through 6 may be fabricated.

After the process discussed with reference to FIG. 27 is performed, if a middle region of the active layer 130a is etched using an etch selectivity according to the germanium concentration, the semiconductor devices 3 and 4 illustrated in FIGS. 7 and 8 may be fabricated.

FIGS. 28 through 39 are diagrams illustrating a method of fabricating a semiconductor device according to an exemplary embodiment of the present inventive concept.

Figure 28:
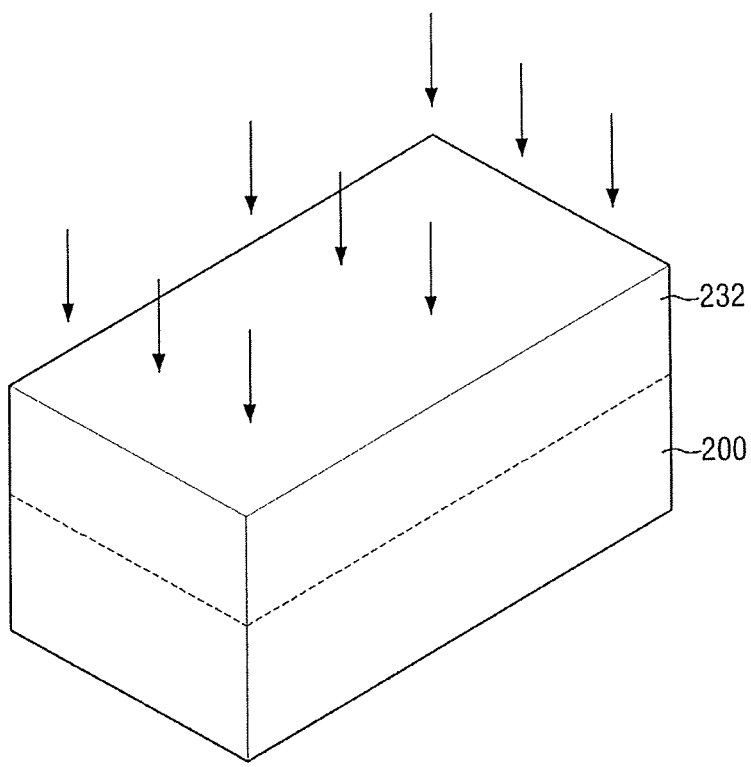
FIGS. 28 through 39 are diagrams illustrating a method of fabricating a semiconductor device according to an exemplary embodiment of the present inventive concept.

Referring to FIG. 28, a first epitaxial layer 232 may be formed on the substrate 200 by, e.g., an epitaxial growth process. The first epitaxial layer 232 may include, e.g., silicon germanium (SiGe).

Figure 29:
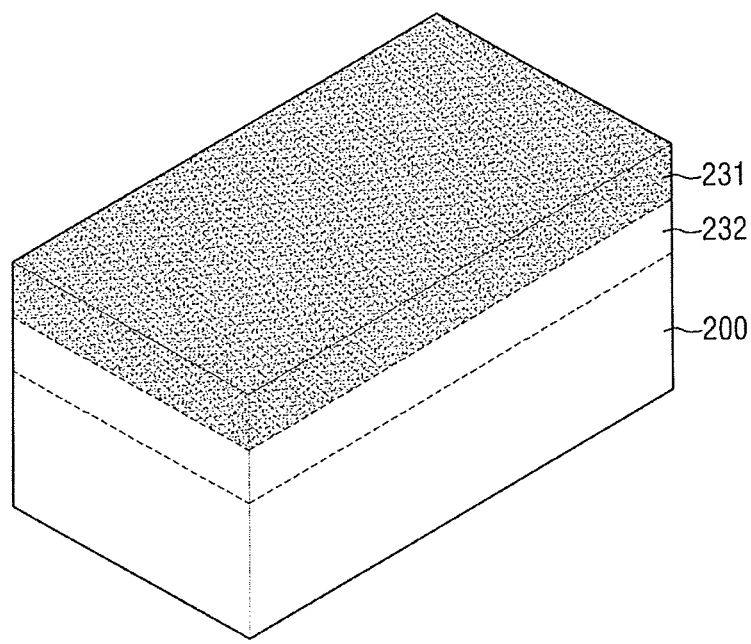

Referring to FIGS. 28 and 29, an oxidation process for germanium condensation may be performed on the first epitaxial layer 232. The oxidation process may push germanium to an upper end of the first epitaxial layer 232, thereby forming a second epitaxial layer 231 with a relatively high concentration of germanium.

In the process of forming the second epitaxial layer 231, silicon oxide ($SiO_2$) may be deposited on the second epitaxial layer 231. If the silicon oxide is removed, the first epitaxial layer 232 and the second epitaxial layer 231 may be formed sequentially on the substrate 200. The concentration of germanium in the second epitaxial layer 231 may be higher than the concentration of germanium in the first epitaxial layer 232. For example, the concentration of germanium in the second epitaxial layer 231 may be higher than the concentration of germanium in the first epitaxial layer 232 by 25% or more, but the present inventive concept is not limited thereto.

Figure 30:
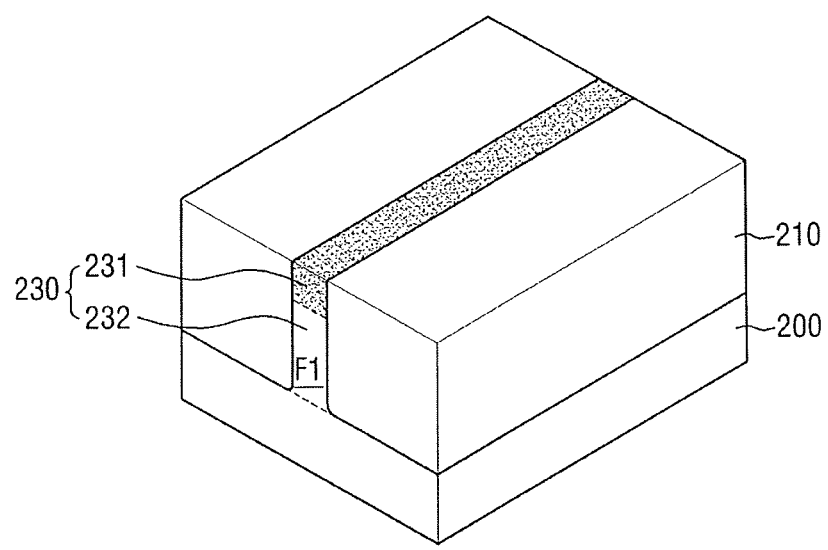

Referring to FIG. 30, the second epitaxial layer 231, the first epitaxial layer 232, and the substrate 200 may be etched. The etching of the second epitaxial layer 231, the first epitaxial layer 232, and the substrate 200 may be performed sequentially. The etching of the first epitaxial layer 232 and the second epitaxial layer 231 may form the fin F1. The device isolation layer 210 may be formed covering both sidewalls of the fin F1. The device isolation layer 210 may include a material including at least one of a silicon oxide layer, a silicon nitride layer, and a silicon oxynitride layer.

Figure 31:
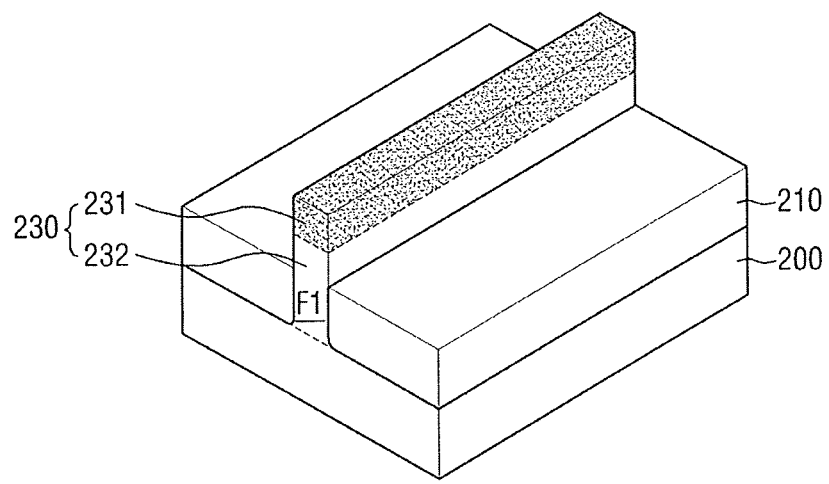

Referring to FIG. 31, an upper portion of the device isolation layer 210 may be recessed to expose an upper portion of the fin F1. The recess process may include a selective etching process.

A portion of the fin F1 which protrudes upward from the device isolation layer 210 may be formed by using an epitaxial layer. After the formation of the device isolation layer 210, a portion of the fin F1 may be formed by an epitaxial process (e.g., without a recess process) using a top surface of the fin F1 exposed by the device isolation layer 210 as a seed.

A doping process for controlling a threshold voltage may be performed on the fin F1. If a fin type transistor is an NMOS transistor, boron (B) may be used as an impurity. If the fin type transistor is a PMOS transistor, phosphorous (P) or arsenic (As) may be used as impurities.

Figure 32:
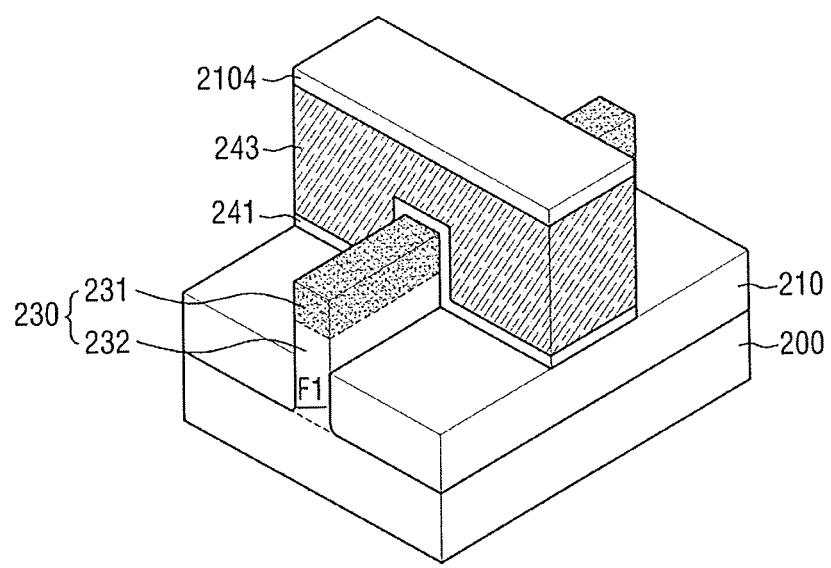

Referring to FIG. 32, an etching process may be performed using a mask pattern 2104, thereby forming a dummy gate insulating layer 241 and a dummy gate electrode 243 which may extend in a first direction and may intersect the fin F1.

For example, the dummy gate insulating layer 241 may include a silicon oxide layer, and the dummy gate electrode 243 may include polysilicon.

Figure 33:
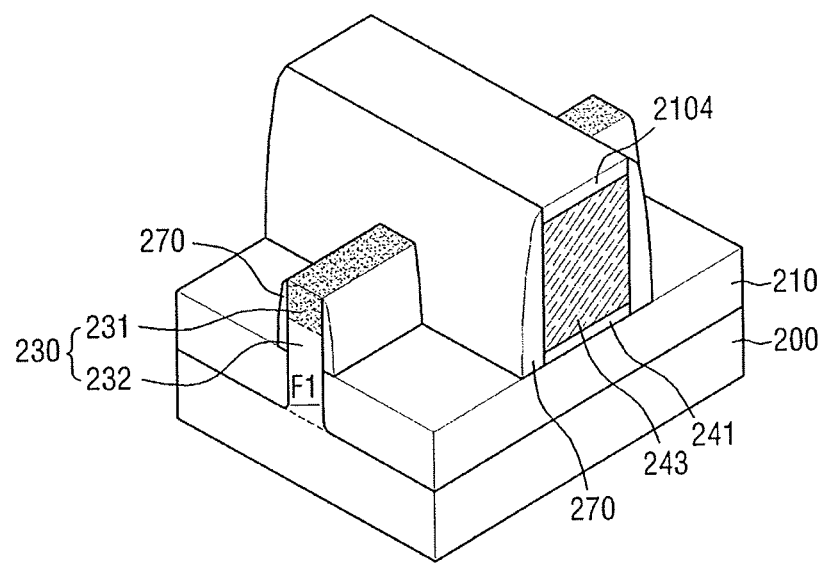

Referring to FIG. 33, spacers 270 may be formed on sidewalls of the dummy gate electrode 243 and sidewalls of the fin F1.

For example, an insulating layer may be foamed on the structure having the dummy gate electrode 243, and then an etch-back process may be performed to form the spacers 270. The spacers 270 may expose a top surface of the mask pattern 2104 and the top surface of the fin F1. Each of the spacers 270 may include a silicon nitride layer or a silicon oxynitride layer.

Figure 34:
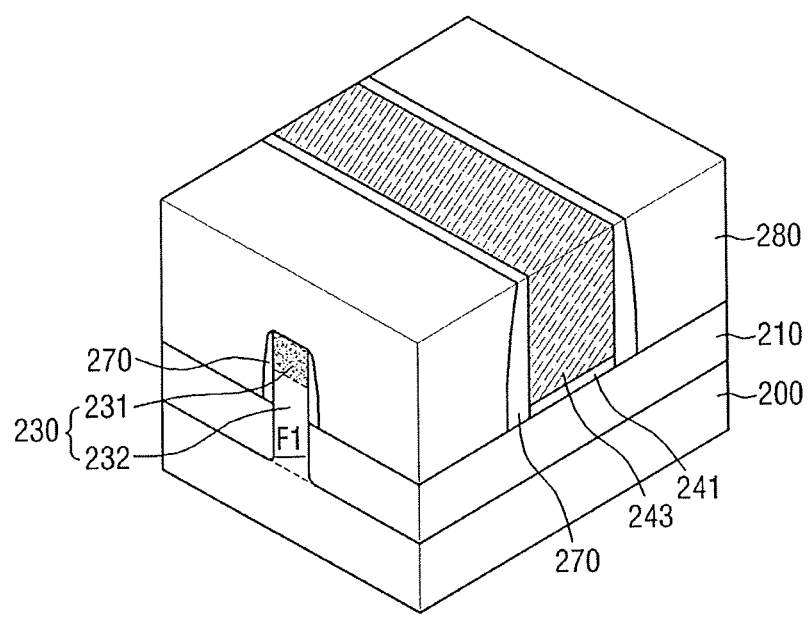

Referring to FIG. 34, the interlayer insulating film 280 may be formed on the structure having the spacers 270. The interlayer insulating film 280 may include a silicon oxide layer.

The interlayer insulating film 280 may be planarized until a top surface of the dummy gate electrode 243 is exposed. As a result, the mask pattern 2104 may be removed, and the top surface of the dummy gate electrode 243 may be exposed.

Figure 35:
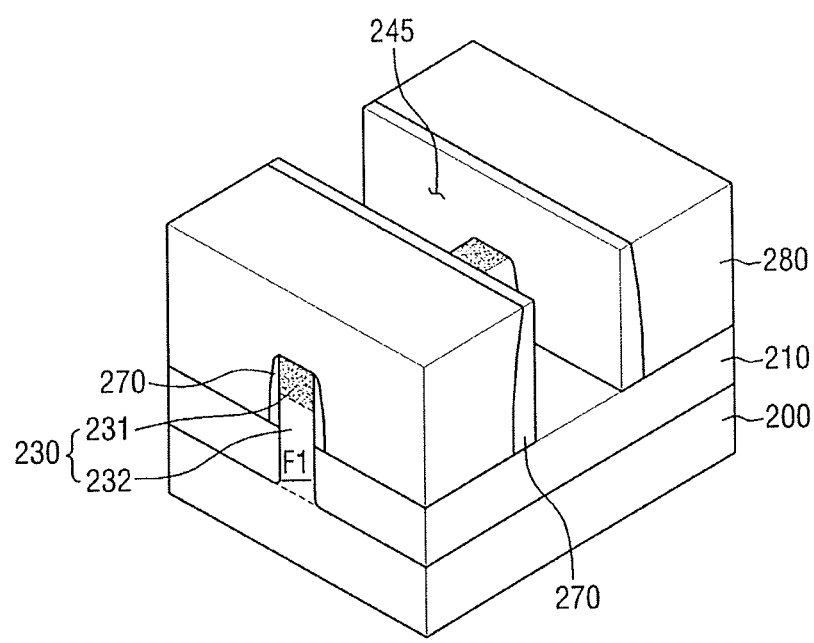

Referring to FIG. 35, the dummy gate insulating layer 241 and the dummy gate electrode 243 may be removed. The removal of the dummy gate insulating layer 241 and the dummy gate electrode 243 may form a trench 245 which may expose the device isolation layer 210.

Figure 36:
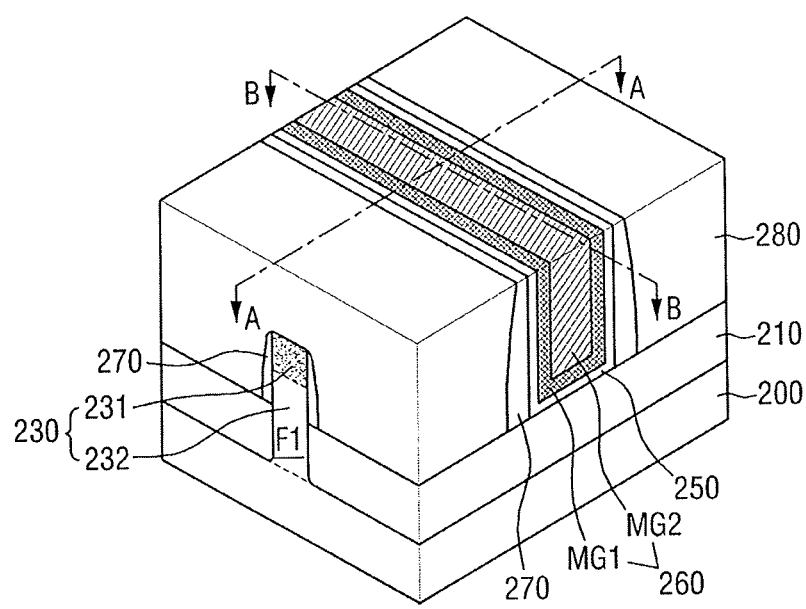
Figure 37:
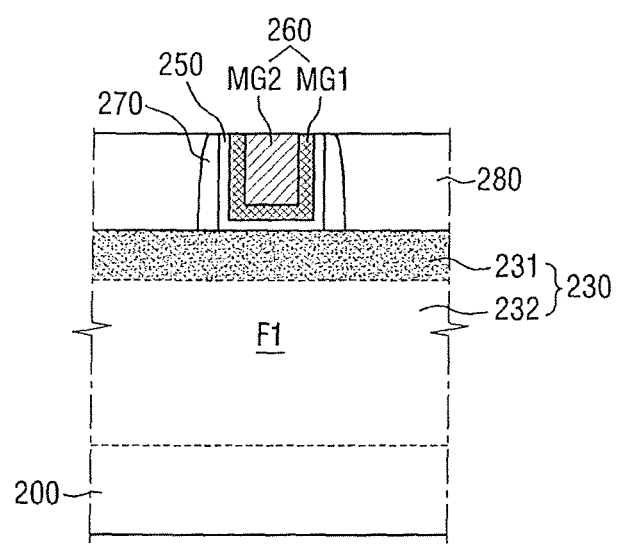
Figure 38:
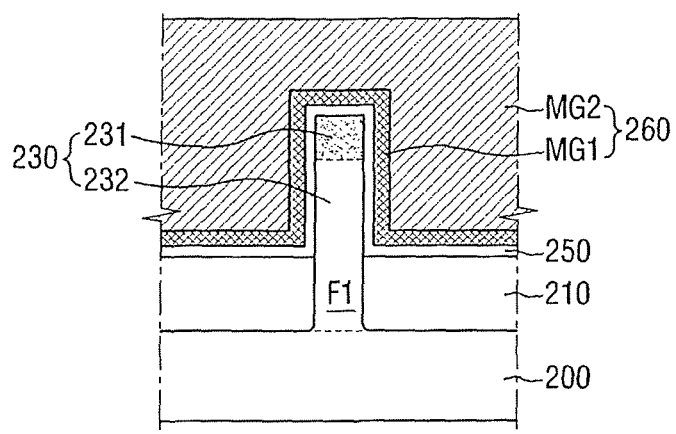

Referring to FIGS. 36 through 38, the gate insulating layer 250 and the gate electrode 260 may be formed in the trench 245.

The gate insulating layer 250 may include a high-k material having a higher dielectric constant than a silicon oxide layer. For example, the gate insulating layer 250 may include $HfO_2$, $ZrO_2$, or $Ta_2O_5$. The gate insulating layer 250 may be formed along sidewalls and a bottom surface of the trench 245. The gate insulating layer 250 may be formed substantially conformally along the sidewalls and the bottom surface of the trench 245.

The gate electrode 260 may include metal layers (e.g., MG1 and MG2). The gate electrode 260 may be formed by stacking two or more metal layers (e.g., MG1 and MG2). The first metal layer MG1 may control a work function, and the second metal layer MG2 may fill a space formed by the first metal layer MG1. For example, the first metal layer MG1 may include at least one of TiN, TaN, TiC, and TaC. The second metal layer MG2 may include W or Al. The gate electrode 260 may include a material (e.g., Si or SiGe) other than a metal.

Figure 39:
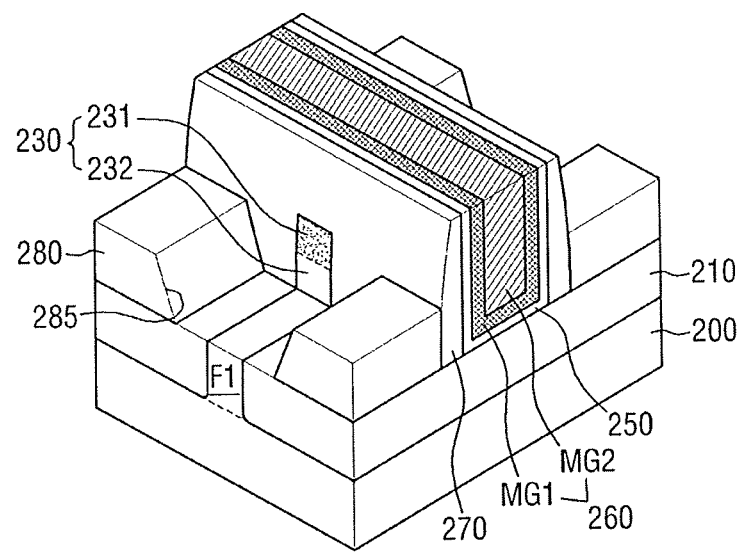

Referring to FIG. 39, recesses 285 may be formed in the fin F1 disposed on two sides of the gate electrode 260.

The recesses 285 may be formed in the fin F1 disposed on two sides of the gate electrode 260. Each of the recesses 285 may have sloping sidewalls. Thus, the recesses 285 may become wider as the distance from the substrate 200 increases. The recesses 285 may be wider than the fin F1.

While the present inventive concept has been particularly shown and described with reference to exemplary embodiments thereof, it will be understood by those of ordinary skill in the art that various changes in form and details may be made therein without departing from the spirit and scope of the present inventive concept.

What is claimed is:

1. A semiconductor device comprising:
   a fin disposed on a substrate along a first direction;
   a sacrificial layer disposed on the fin;
   an active layer disposed on the sacrificial layer;
   a gate insulating layer and a gate electrode disposed along a second direction intersecting the first direction, wherein the gate insulating layer covers substantially entire top, side and bottom surfaces of the active layer; and
   a source or drain region disposed on at least one side of the gate electrode on the substrate,
   wherein a width of each of a first region and a second region of the active layer measured in the second direction is greater than a width of a third region of the active layer measured in the second direction, and wherein the third region is disposed between the first region and the second region.

2. The semiconductor device of claim 1, wherein a concentration of germanium in the second region of the active layer is higher than a concentration of germanium in the third region.

3. The semiconductor device of claim 1, wherein a concentration of germanium in the first region of the active layer is higher than a concentration of germanium in the third region.

4. The semiconductor device of claim 1, wherein outer surfaces of each of the first region and the second region of the active layer are curved.

5. The semiconductor device of claim 1, wherein the second region of the active layer is in direct contact with the gate insulating layer.

6. The semiconductor device of claim 1, wherein the first region is disposed farther from the substrate than the second region.

7. A semiconductor device comprising:
a fin disposed on a substrate along a first direction;
a sacrificial layer disposed on the fin;
an active layer disposed on the sacrificial layer;
a gate insulating layer and a gate electrode disposed along a second direction intersecting the first direction, wherein the gate insulating layer covers substantially entire top, side and bottom surfaces of the active layer; and
a source or drain region disposed on at least one side of the gate electrode on the substrate,
wherein a width of each of a first region and a second region of the active layer measured in the second direction is greater than a width of a third region of the active layer measured in the second direction, wherein the third region is disposed between the first region and the second region, and wherein the second region is closer to the substrate than the first region along a direction orthogonal to an upper surface of the substrate.

8. The semiconductor device of claim 7, wherein a concentration of germanium in the first region of the active layer is higher than a concentration of germanium in the third region.

9. The semiconductor device of claim 8, wherein a concentration of germanium in the second region of the active layer is higher than a concentration of germanium in the third region.

10. The semiconductor device of claim 7, wherein outer surfaces of each of the first region and the second region of the active layer are curved.

11. The semiconductor device of claim 7, wherein the second region of the active layer is in direct contact with the gate insulating layer.

* * * * *